US012757573B2

(12) United States Patent
Noh et al.

(10) Patent No.: US 12,757,573 B2
(45) Date of Patent: Oct. 6, 2026

(54) METHOD OF MANUFACTURING DISPLAY DEVICE

(71) Applicant: Samsung Display Co., LTD., Yongin-si (KR)

(72) Inventors: Jung-Hun Noh, Yongin-si (KR); Guanghai Jin, Yongin-si (KR); Ju-Won Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 432 days.

(21) Appl. No.: 18/406,397

(22) Filed: Jan. 8, 2024

(65) Prior Publication Data

US 2024/0268146 A1 Aug. 8, 2024

(30) Foreign Application Priority Data

Feb. 3, 2023 (KR) ........................ 10-2023-0014878

(51) Int. Cl.
*H10K 59/12* (2023.01)
*H10D 86/01* (2026.01)

(52) U.S. Cl.
CPC ....... *H10K 59/1201* (2023.02); *H10D 86/021* (2025.01)

(58) Field of Classification Search
CPC ......... G02F 1/136277; G02F 1/136286; G02F 1/1368; G02G 3/3208; G02G 3/3648; H10D 30/0411; H10D 86/021; H10D 86/0251; H10K 59/131; H10K 59/1201; H10K 59/1213; H10K 71/621
See application file for complete search history.

(56) References Cited

U.S. PATENT DOCUMENTS

2020/0258938 A1* 8/2020 Chai ...................... H10D 1/692
2022/0115470 A1* 4/2022 Kim ....................... H10D 86/40

FOREIGN PATENT DOCUMENTS

| | | | |
|---|---|---|---|
| JP | 2008058446 | A | 3/2008 |
| JP | 2008151991 | A | 7/2008 |
| KR | 100873705 | B1 | 12/2008 |
| KR | 101243159 | B1 | 3/2013 |
| KR | 102023185 | B1 | 11/2019 |
| KR | 1020220060664 | A | 5/2022 |

* cited by examiner

*Primary Examiner* — Fazli Erdem
(74) *Attorney, Agent, or Firm* — CANTOR COLBURN LLP

(57) ABSTRACT

A method of manufacturing a display device includes forming an active pattern including a semiconductor area on a substrate, forming a first conductive layer including a floating gate electrode overlapping the semiconductor area on the active pattern, forming a second conductive layer including a control gate electrode overlapping the floating gate electrode on the first conductive layer, forming a global line layer including a first global line electrically connected to the control gate electrode on the second conductive layer, providing a first constant voltage to the first global line, and removing the global line layer.

20 Claims, 16 Drawing Sheets

ACT:DI1,DI2,CHA

ACT:BP,EP1,EP2,IP
EP2:EP2(N-1),EP2(N)

CL2:CG

CL5:US1,US2,US3,US4

METHOD OF MANUFACTURING DISPLAY DEVICE

This application claims priority to Korean Patent Application No. 10-2023-0014878, filed on Feb. 3, 2023, and all the benefits accruing therefrom under 35 U.S.C. § 119, the content of which in its entirety is herein incorporated by reference.

BACKGROUND

1. Field

The disclosure relates generally to a method of manufacturing a display device. More particularly, the disclosure relates to a method of manufacturing a display device that provides visual information.

2. Description of the Related Art

With a development of information technology, an importance of a display device, which is a connection medium between a user and information, is being highlighted. The use of display devices such as liquid crystal display device ("LCD"), organic light-emitting display device ("OLED"), plasma display device ("PDP"), quantum dot display device or the like is increasing, for example.

The display device may include pixels that emit light. The pixels may include a plurality of transistors and a light-emitting element. There may be a difference in threshold voltage between the transistors included in each of the pixels. Such a difference in threshold voltage may cause a deviation in current flowing through the light-emitting element for each pixel.

SUMMARY

Embodiments provide a method of manufacturing a display device that compensates for a threshold voltage of a transistor.

A method of manufacturing a display device in an embodiment of the disclosure includes forming an active pattern including a first conductor area, a semiconductor area adjacent to the first conductor area, and a second conductor area spaced apart from the first conductor area with the semiconductor area interposed therebetween on a substrate, forming a first conductive layer including a floating gate electrode overlapping the semiconductor area on the active pattern, forming a second conductive layer including a control gate electrode overlapping the floating gate electrode on the first conductive layer, forming a global line layer including a first global line electrically connected to the control gate electrode on the second conductive layer, providing a first constant voltage to the first global line, and removing the global line layer.

In an embodiment, in the providing the first constant voltage to the first global line, a second constant voltage may be provided to the first conductor area and a third constant voltage may be provided to the second conductor area.

In an embodiment, the method may further include forming a light-emitting element layer on the second conductive layer after the removing the global line layer.

In an embodiment, the first conductor area, the semiconductor area, the second conductor area, the floating gate electrode, and the control gate electrode may define a driving transistor that provides a driving current to the light-emitting element layer.

In an embodiment, the providing the first constant voltage to the first global line may include compensating for a threshold voltage of the driving transistor.

In an embodiment, the compensating for the threshold voltage of the driving transistor may include an operation in which the first constant voltage has a relatively low level voltage and the second constant voltage has a voltage higher than the first constant voltage and an operation in which the first constant voltage has a relatively high level voltage and the second constant voltage has a voltage lower than the first constant voltage.

In an embodiment, an absolute value of a difference between the first constant voltage and the second constant voltage may be greater than or equal to about 80V and less than or equal to about 100V.

In an embodiment, an absolute value of a difference between the second voltage and the third constant voltage may be greater than or equal to about 0V and less than or equal to about 0.2V.

In an embodiment, the forming the global line layer may include forming a second global line electrically connected to the first conductor area.

In an embodiment, the forming the global line layer may include forming a third global line electrically connected to the second conductor area.

In an embodiment, at least one conductive layer may be further disposed between the global line layer and the second conductive layer.

In an embodiment, the first global line may be electrically connected to the floating gate electrode through at least one connection electrode.

A method of manufacturing a display device in another embodiment of the disclosure includes forming an active pattern including a first conductor area, a semiconductor area adjacent to the first conductor area, and a second conductor area spaced apart from the first conductor area with the semiconductor area interposed therebetween on a substrate, forming a first conductive layer including a floating gate electrode overlapping the semiconductor area on the active pattern, forming a second conductive layer including a control gate electrode overlapping the floating gate electrode on the first conductive layer, forming a global line layer including a first global line electrically connected to the second conductor area of the active pattern on the second conductive layer, providing a first constant voltage to the first global line, removing the global line layer, and forming a light-emitting element layer on the second conductive layer after the removing the global line layer.

In an embodiment, in the providing the first constant voltage to the first global line, a second constant voltage may be provided to the control gate electrode and a third constant voltage may be provided to the first conductor area.

In an embodiment, the first conductor area, the semiconductor area, the second conductor area, the floating gate electrode, and the control gate electrode may define a driving transistor that provides a driving current to the light-emitting element layer.

In an embodiment, the providing the first constant voltage to the first global line may include compensating for a threshold voltage of the driving transistor.

In an embodiment, the compensating for the threshold voltage of the driving transistor may include an operation in which the second constant voltage has a relatively low level voltage and the third constant voltage has a voltage higher than the second constant voltage and an operation in which the second constant voltage has a relatively high level voltage and the third constant voltage has a voltage lower than the second constant voltage.

In an embodiment, an absolute value of a difference between the second constant voltage and the third constant voltage may be greater than or equal to about 80V and less than or equal to about 100V.

In an embodiment, the forming the global line layer may include forming a second global line electrically connected to the first conductor area.

In an embodiment, the forming the global line layer may include forming a third global line electrically connected to the control gate electrode.

A method of manufacturing a display device in embodiments of the disclosure may include forming a global line during a manufacturing process of the display device to compensate for a threshold voltage of a driving transistor and providing a constant voltage to the global line.

A relatively high voltage for compensating for the threshold voltage may be provided to a gate electrode of the driving transistor through the global line. That is, a problem in which a light-emitting element and other transistors may be damaged when the relatively high voltage is provided to the gate electrode of the driving transistor may be improved.

In addition, the gate electrode of the driving transistor may include a floating gate electrode and a control gate electrode. That is, a threshold voltage compensation value may be stored in the driving transistor. Accordingly, a separate transistor for compensating the threshold voltage of the driving transistor may not be desired.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
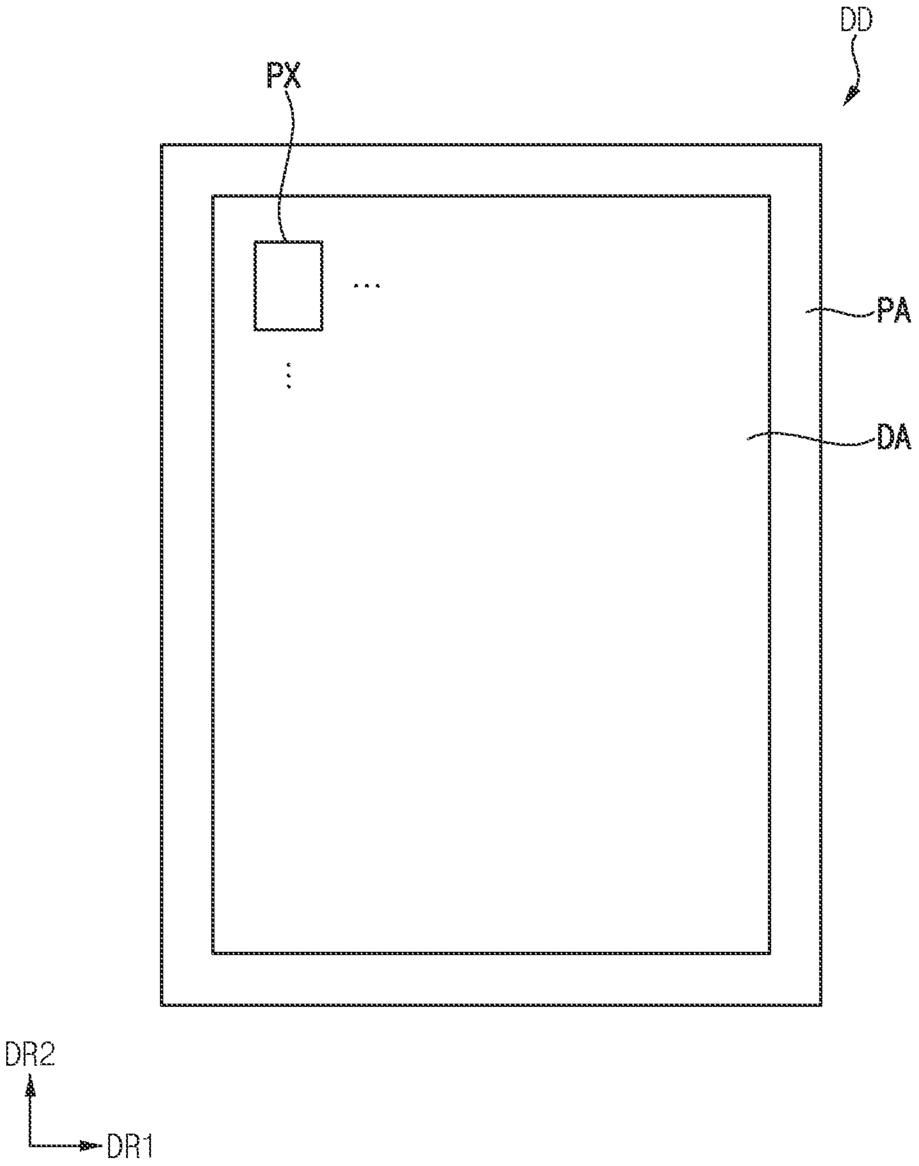
FIG. 1 is a plan view illustrating an embodiment of a display device according to the disclosure.

Hereinafter, embodiments of the disclosure will be described in detail with reference to the accompanying drawings. The same reference numerals are used for the same components in the drawings, and redundant descriptions of the same components will be omitted.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a plan view illustrating a display device according to the disclosure.

In this specification, a plane may be defined by a first direction DR1 and a second direction DR2 crossing the first direction DR1. In an embodiment, the first direction DR1 and the second direction DR2 may be perpendicular to each other, for example.

Referring to FIG. 1, a display device DD in an embodiment of the disclosure may include a display area DA and a peripheral area PA. The display area DA may be defined as an area capable of displaying an image by generating light or adjusting transmittance of light provided from an external light source. The peripheral area PA may be defined as an area not displaying an image. In addition, the peripheral area PA may surround at least a part of the display area DA.

A plurality of pixels PX may be disposed in the display area DA. Each of the pixels PX may emit light. The pixels PX may be repeatedly arranged along the first direction DR1 and the second direction DR2.

Figure 2:
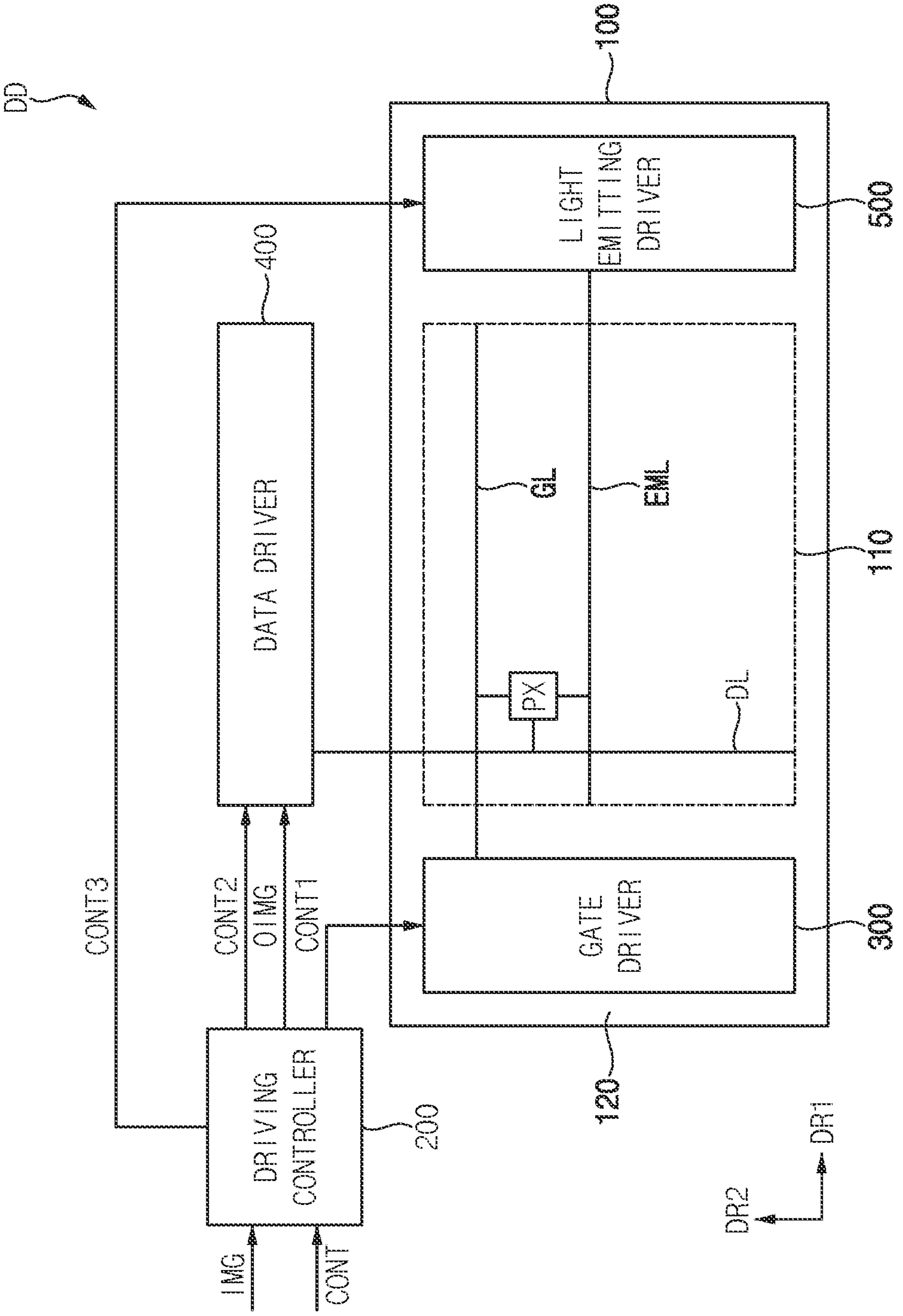
FIG. 2 is a block diagram illustrating the display device of FIG. 1.

FIG. 2 is a block diagram illustrating the display device of FIG. 1.

Referring to FIG. 2, the display device DD may include a display panel 100 and a display panel driver. The display panel 100 may include a display part 110 that displays an image and a peripheral part 120 disposed adjacent to the display part 110. In this case, the peripheral part 120 may include a gate driver 300 and a light-emitting driver 500. The display panel driver may drive the display panel 100. The display panel driver may include a driving controller 200 and a data driver 400.

The display panel 100 may include a plurality of gate lines GL, a plurality of data lines DL, a plurality of light-emitting control lines EML, and the pixels PX electrically connected to the gate lines GL, the data lines DL, and the light-emitting control lines EML.

The gate lines GL and the light-emitting control lines EML may extend in the first direction DR1, and the data lines DL may extend in the second direction DR2.

The driving controller 200 may receive an input image data IMG and an input control signal CONT from a host processor (e.g., a graphic processing unit ("GPU")). In an embodiment, the input image data IMG may include red image data, green image data, and blue image data, for example. The input control signal CONT may include a master clock signal, data enable, etc. The input control signal CONT may further include a vertical synchronization signal and a horizontal synchronization signal.

The driving controller 200 may generate a first control signal CONT1, a second control signal CONT2, a third control signal CONT3, and an output image data OIMG based on the input image data IMG and the input control signal CONT.

The driving controller 200 may generate the first control signal CONT1 for controlling the operation of the gate driver 300 based on the input control signal CONT. In addition, the driving controller 200 may output the first control signal CONT1 to the gate driver 300. The first control signal CONT1 may include a vertical start signal and a gate clock signal.

The driving controller 200 may generate the second control signal CONT2 for controlling the operation of the data driver 400 based on the input control signal CONT. In addition, the driving controller 200 may output the second control signal CONT2 to the data driver 400. The second control signal CONT2 may include a horizontal start signal and a load signal.

The driving controller 200 may generate the third control signal CONT3 for controlling the operation of the light-emitting driver 500 based on the input control signal CONT. In addition, the driving controller 200 may output the third control signal CONT3 to the light-emitting driver 500. The third control signal CONT3 may include a vertical start signal and a light-emitting clock signal.

The driving controller 200 may generate the output image data OIMG by receiving the input image data IMG and the input control signal CONT. In addition, the driving controller 200 may output the output image data OIMG to the data driver 400.

The gate driver 300 may generate gate signals for driving the gate lines GL in response to the first control signal CONT1 received from the driving controller 200. The gate signals may include a write gate signal (e.g., a write gate signal GW of FIG. 3) and a bias gate signal (e.g., a bias gate signal GB of FIG. 3). The gate driver 300 may output the gate signals to the gate lines GL.

The data driver 400 may receive the second control signal CONT2 and the output image data OIMG from the driving controller 200. The data driver 400 may generate a data voltage (e.g., a data voltage VDATA of FIG. 3) by converting the output image data OIMG into an analog voltage. The data driver 400 may output the data voltage to the data lines DL.

The light-emitting driver 500 may receive the third control signal CONT3 from the driving controller 200. The light-emitting driver 500 may generate a light-emitting control signal (e.g., a light-emitting control signal EM of FIG. 3) for driving the light-emitting control lines EML. The light-emitting driver 500 may output the light-emitting control signal to the light-emitting control lines EML.

FIG. 2 illustrates that the gate driver 300 is disposed on a first side of the display part 110 and the light-emitting driver 500 is disposed on a second side of the display part 110 for convenience of description, but the disclosure is not limited thereto. In an embodiment, both the gate driver 300 and the light-emitting driver 500 may be disposed on the first side of the display part 110, for example. In an embodiment, the gate driver 300 and the light-emitting driver 500 may be unitary, for example.

Figure 3:
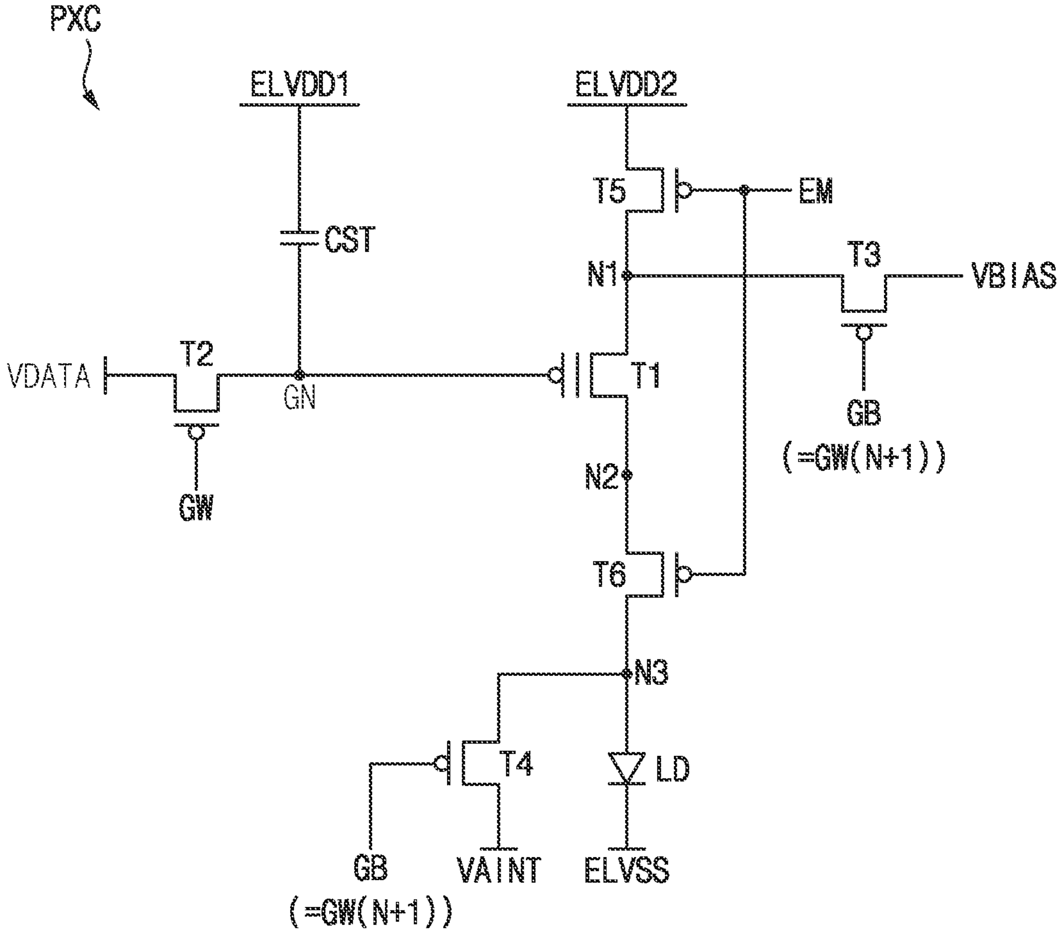
FIG. 3 is a circuit diagram illustrating a pixel included in the display device of FIG. 1.
Figure 4:
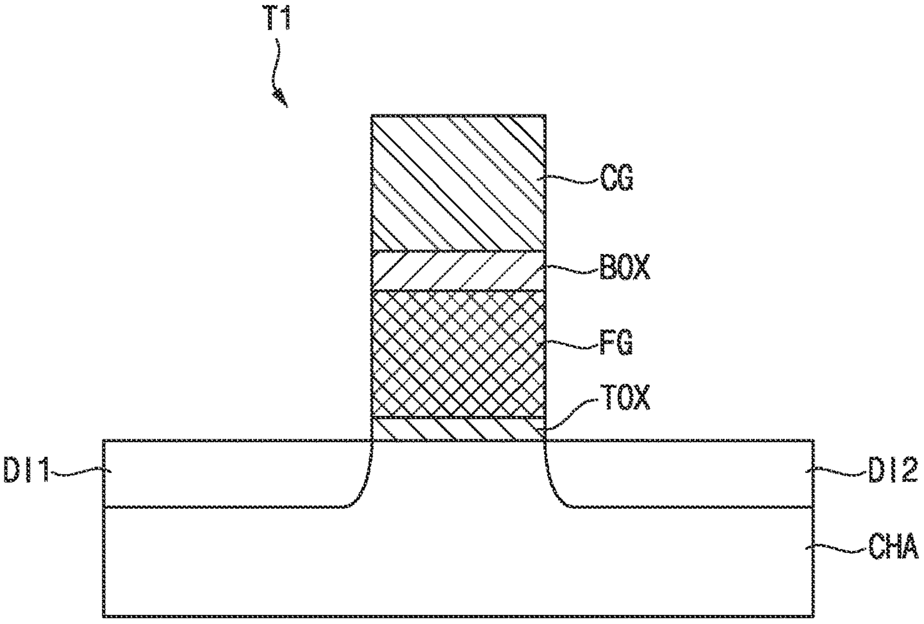
FIG. 4 is a cross-sectional view illustrating the structure of a first transistor included in the pixel circuit of FIG. 3.

FIG. 3 is a circuit diagram illustrating a pixel included in the display device of FIG. 1. FIG. 4 is a cross-sectional view illustrating the structure of a first transistor included in the pixel circuit of FIG. 3.

Referring to FIG. 3, a pixel circuit PXC may include a light-emitting element LD, a first transistor T1, a second transistor T2, a third transistor T3, a fourth transistor T4, a fifth transistor T5, a sixth transistor T6, and a storage capacitor CST. However, embodiments of the disclosure are not limited thereto. In other words, some of the above components of the pixel circuit PXC may be omitted or other components may be added to the pixel circuit PXC.

The first transistor T1 may include a gate electrode, a first electrode, and a second electrode. In an embodiment, the gate electrode may include a floating gate electrode (e.g., a floating gate electrode FG of FIG. 4) and a control gate electrode (e.g., a control gate electrode CG of FIG. 4). A detailed description thereof will be described later with reference to FIG. 4. The gate electrode of the first transistor T1 may be connected to a gate node GN. The first electrode of the first transistor T1 may be connected to a first node N1. The second electrode of the first transistor T1 may be connected to a second node N2. The first transistor T1 may generate a driving current based on a voltage difference between the gate electrode and the first electrode. In an embodiment, the first transistor T1 may be also referred to as a driving transistor, for example.

The second transistor T2 may include a gate electrode, a first electrode, and a second electrode. The gate electrode of the second transistor T2 may receive a write gate signal GW. The second transistor T2 may be turned on or off in response to the write gate signal GW. The first electrode of the second transistor T2 may receive a data voltage VDATA. The second electrode of the second transistor T2 may be connected to the gate node GN. While the second transistor T2 is turned on, the second transistor T2 may provide the data voltage VDATA to the gate electrode of the first transistor T1. In an embodiment, the second transistor T2 may be also referred to as a switching transistor, for example.

The third transistor T3 may include a gate electrode, a first electrode, and a second electrode. The gate electrode of the third transistor T3 may receive a bias gate signal GB. In an embodiment, the bias gate signal GB may be a next write gate signal GW(N+1). The next write gate signal GW(N+1) may be defined as a write gate signal of the next stage (e.g., a write gate signal of (N+1) stage) of the write gate signal GW (e.g., a write gate signal of N stage). That is, the third transistor T3 may be turned on or off in response to the next write gate signal GW(N+1). The first electrode of the third transistor T3 may receive a bias voltage VBIAS. The second electrode of the third transistor T3 may be connected to the first node N1. While the third transistor T3 is turned on, the third transistor T3 may provide the bias voltage VBIAS to the first electrode of the first transistor T1. In other words, a hysteresis characteristic of the first transistor T1 may be initialized. In an embodiment, the third transistor T3 may be also referred to as an initialization transistor, for example.

The fourth transistor T4 may include a gate electrode, a first electrode, and a second electrode. The gate electrode of the fourth transistor T4 may receive the bias gate signal GB. In an embodiment, the bias gate signal GB may be the next write gate signal GW(N+1). That is, the fourth transistor T4 may be turned on or off in response to the next write gate signal GW(N+1). The first electrode of the fourth transistor T4 may receive an anode initialization voltage VAINT. The second electrode of the fourth transistor T4 may be connected to a third node N3. While the fourth transistor T4 is turned on, the fourth transistor T4 may provide the anode initialization voltage VAINT to an anode electrode of the light-emitting element LD. In an embodiment, the fourth transistor T4 may be also referred to as an anode initialization transistor, for example.

The fifth transistor T5 may include a gate electrode, a first electrode, and a second electrode. The gate electrode of the fifth transistor T5 may receive a light-emitting control signal EM. The fifth transistor T5 may be turned on or off in response to the light-emitting control signal EM. The first electrode of the fifth transistor T5 may receive a second driving voltage ELVDD2. The second electrode of the fifth transistor T5 may be connected to the first node N1. While the fifth transistor T5 is turned on, the fifth transistor T5 may provide the second driving voltage ELVDD2 to the first electrode of the first transistor T1. In an embodiment, the fifth transistor T5 may be also referred to as a first light-emitting control transistor, for example.

The sixth transistor T6 may include a gate electrode, a first electrode, and a second electrode. The gate electrode of the sixth transistor T6 may receive the light-emitting control signal EM. The sixth transistor T6 may be turned on or off in response to the light-emitting control signal EM. The first electrode of the sixth transistor T6 may be connected to the second node N2. The second electrode of the sixth transistor T6 may be connected to the third node N3. While the sixth transistor T6 is turned on, the sixth transistor T6 may provide the driving current generated by the first transistor T1 to the light-emitting element LD. In an embodiment, the sixth transistor T6 may be also referred to as a second light-emitting control transistor, for example.

In an embodiment, each of the first, second, third, fourth, fifth, and sixth transistors T1, T2, T3, T4, T5, and T6 may be a p-channel metal-oxide-semiconductor ("PMOS") transistor. Accordingly, an active pattern of each of the first, second, third, fourth, fifth, and sixth transistors T1, T2, T3, T4, T5, and T6 may include a silicon semiconductor doped with cations.

In addition, each of the write gate signal GW for turning on the second transistor T2, the light-emitting control signal EM for turning on the fifth transistor T5 and the sixth transistor T6, and the bias gate signal GB for turning on the third transistor T3 and the fourth transistor T4 may have a relatively low level.

The storage capacitor CST may include a first electrode and a second electrode. The first electrode of the storage capacitor CST may receive a first driving voltage ELVDD1. The second electrode of the storage capacitor CST may be connected to the gate node GN.

In an embodiment, the first driving voltage ELVDD1 and the second driving voltage ELVDD2 may be equal to each other. In another embodiment, the first driving voltage ELVDD1 and the second driving voltage ELVDD2 may be different from each other.

The light-emitting element LD may include the anode electrode and a cathode electrode. The anode electrode of the light-emitting element LD may be connected to the third node N3. The cathode electrode of the light-emitting element LD may receive a common voltage ELVSS. The light-emitting element LD may generate light having a luminance corresponding to the driving current.

Referring further to FIG. 4, the first transistor T1 may be defined by an active pattern ACT, a tunneling oxide layer TOX, a floating gate electrode FG, a blocking oxide layer BOX, and a control gate electrode CG.

The active pattern ACT may include a first conductor area DI1, a semiconductor area CHA, and a second conductor area DI2. Each of the first conductor area DI1 and the second conductor area DI2 may be adjacent to the semiconductor area CHA. In addition, the first conductor area DI1 and the second conductor area DI2 may be spaced apart from each other with the semiconductor area CHA interposed therebetween.

Each of the first conductor area DI1 and the second conductor area DI2 may be a doped area doped with impurities, and the semiconductor area CHA may be an un-doped area or a doped area doped with a lower concentration than the first and second conductor areas DI1 and DI2. In an embodiment, each of the first conductor area DI1 and the second conductor area DI2 may be a doped area doped with cations, for example. In this case, the semiconductor area CHA may be an N-type semiconductor area.

The first conductor area DI1 and the second conductor area DI2 may serve as an input terminal and/or an output terminal of a transistor. The semiconductor area CHA may be an area defining a channel of a transistor. The semiconductor area CHA may be an area overlapping each of the floating gate electrode FG and the control gate electrode CG in a plan view.

The tunneling oxide layer TOX may be disposed on the active pattern ACT. The tunneling oxide layer TOX may include silicon oxide, silicon nitride, silicon oxynitride, etc. These may be used alone or in any combinations with each other.

The floating gate electrode FG may be disposed on the tunneling oxide layer TOX. The floating gate electrode FG may overlap the semiconductor area CHA in a plan view. The floating gate electrode FG may include a metal, an alloy, a metal nitride, a conductive metal oxide, a transparent conductive material, etc. These may be used alone or in any combinations with each other.

The blocking oxide layer BOX may be disposed on the floating gate electrode FG. The blocking oxide layer BOX may include an oxide-nitride-oxide ("O—N—O") layer. The blocking oxide layer BOX may block electron exchange between the floating gate electrode FG and the control gate electrode CG.

The control gate electrode CG may be disposed on the blocking oxide layer BOX. The control gate electrode CG may overlap the floating gate electrode FG in a plan view. The control gate electrode CG may include a metal, an alloy, a metal nitride, a conductive metal oxide, a transparent conductive material, etc. These may be used alone or in any combinations with each other.

Before the threshold voltages of the first transistors T1 are compensated for, the threshold voltages of the first transistors T1 for each pixel may be different from each other. In other words, the threshold voltage distribution of the first transistor T1 for each pixel may be large.

To compensate for the threshold voltage of the first transistor T1, a first constant voltage may be provided to the control gate electrode CG, a second constant voltage may be provided to the first conductor area DI1, and a third constant voltage may be provided to the second conductor area DI2.

In an embodiment, in order to lower the threshold voltage of the first transistor T1, the first constant voltage may have a relatively low level voltage and the second constant voltage may have a voltage higher than the first constant voltage, for example. In this case, electrons existing in the floating gate electrode FG may move to the semiconductor area CHA through the tunneling oxide layer TOX. Accordingly, the threshold voltage of the first transistor T1 may be decreased.

In another embodiment, in order to increase the threshold voltage of the first transistor T1, the first constant voltage may have a relatively high level voltage and the second constant voltage may have a voltage lower than the first constant voltage. In this case, electrons existing in the semiconductor area CHA may move to the floating gate electrode FG through the tunneling oxide layer TOX. Accordingly, the threshold voltage of the first transistor T1 may be increased.

That is, the threshold voltage distribution of the first transistor T1 for each pixel may be decreased while the threshold voltages of the first transistors T1 included in the pixels is collectively decreased and increased.

In addition, by maintaining electrons stored in the floating gate electrode FG of the first transistor T1 (i.e., remembering electronic information), a threshold voltage compensation value with improved threshold voltage distribution may be stored in the first transistor T1. That is, a separate transistor for compensating the threshold voltage of the first transistor T1 may not be desired.

Figure 5:
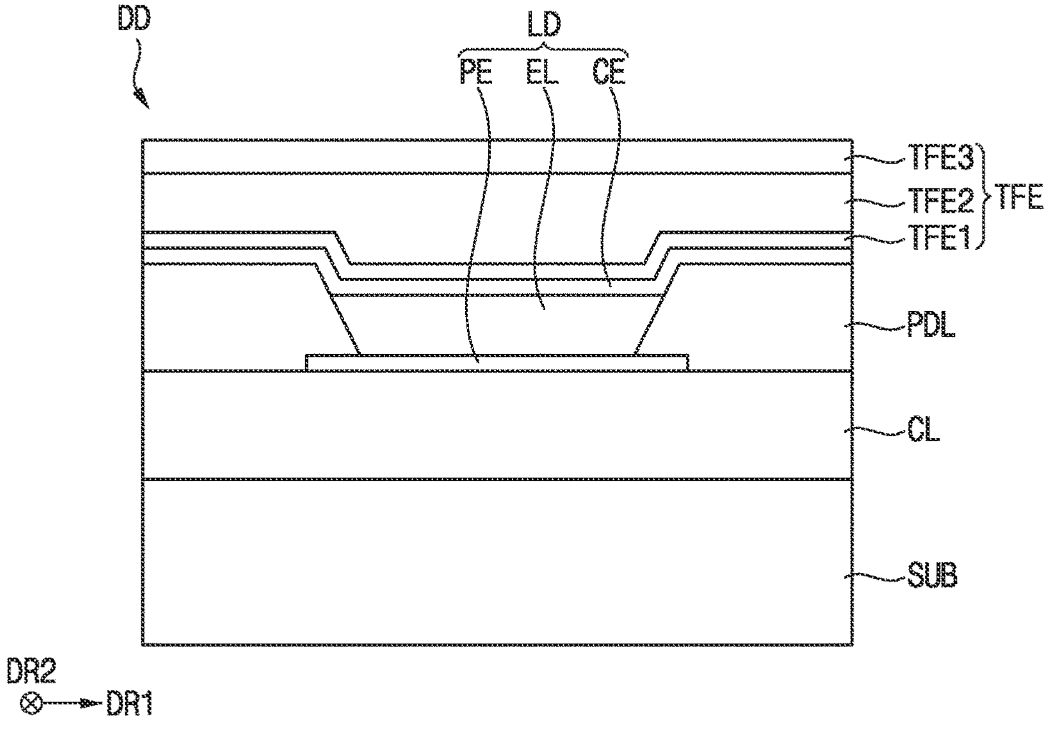
FIG. 5 is a cross-sectional view illustrating the display device of FIG. 1.

FIG. 5 is a cross-sectional view illustrating the display device of FIG. 5. For example, FIG. 5 is a cross-sectional view illustrating an embodiment of a cross-section of the pixel PX of FIG. 1.

Referring to FIG. 5, the display device DD in an embodiment of the disclosure may include a substrate SUB, a circuit layer CL, the light-emitting element LD, a pixel defining layer PDL, and an encapsulation layer TFE. In this case, the light-emitting element LD may include an anode electrode PE, a light-emitting layer EL, and a cathode electrode CE.

The substrate SUB may include a transparent material or an opaque material. The substrate SUB may include or consist of a transparent resin substrate. A polyimide substrate may be mentioned in an embodiment of the transparent resin substrate. In this case, the polyimide substrate may include a first organic layer, a first barrier layer, a second organic layer, etc. In an alternative embodiment, the substrate SUB may include a quartz substrate, a synthetic quartz substrate, a calcium fluoride substrate, a fluorine-doped quartz substrate, a soda-lime glass substrate, a non-alkali glass substrate, etc. These may be used alone or in any combinations with each other.

The circuit layer CL may be disposed on the substrate SUB. The circuit layer CL may provide signals and voltages for the light-emitting element LD to emit light to the light-emitting element LD. In an embodiment, the circuit layer CL may include a transistor, a conductive layer, an insulating layer, etc., for example.

The anode electrode PE may be disposed on the circuit layer CL. The anode electrode PE may receive the signals and the voltages from the circuit layer CL. In an embodiment, the anode electrode PE may include a metal, an alloy, a metal nitride, a conductive metal oxide, a transparent conductive material, etc., for example. These may be used alone or in any combinations with each other.

The pixel defining layer PDL may be disposed on the circuit layer CL and the anode electrode PE. An opening exposing at least a part of an upper surface of the anode electrode PE may be defined in the pixel defining layer PDL. As the pixel defining layer PDL defines the opening, the pixel defining layer PDL may define the pixel PX that emits light. The pixel defining layer PDL may include an organic insulating material or an inorganic insulating material. In an embodiment, the organic insulating material may include photoresist, polyacryl-based resin, polyimide-based resin, acryl-based resin, etc., for example. These may be used alone or in any combinations with each other.

The light-emitting layer EL may be disposed on the anode electrode PE. Specifically, the light-emitting layer EL may be disposed in the opening of the pixel defining layer PDL. The light-emitting layer EL may include materials for emitting light. In an embodiment, the light-emitting layer EL may include an organic light-emitting material and/or an inorganic light-emitting material, for example.

The cathode electrode CE may be disposed on the pixel defining layer PDL and the light-emitting layer EL. In an embodiment, the cathode electrode CE may include a metal, an alloy, a metal nitride, a conductive metal oxide, a transparent conductive material, etc., for example. These may be used alone or in any combinations with each other. Accordingly, the light-emitting element LD including the anode electrode PE, the light-emitting layer EL, and the cathode electrode CE may be disposed on the substrate SUB.

The encapsulation layer TFE may be disposed on the cathode electrode CE. The encapsulation layer TFE may protect the light-emitting element LD from external oxygen and moisture. The encapsulation layer TFE may include at least one inorganic layer and at least one organic layer. In an embodiment, the encapsulation layer TFE may include a first inorganic layer TFE1 disposed on the cathode electrode CE, an organic layer TFE2 disposed on the first inorganic layer TFE1, and a second inorganic layer TFE3 disposed on the organic layer TFE2, for example.

Although the display device DD of the disclosure is described by limiting the organic light-emitting display device ("OLED"), the configuration of the disclosure is not limited thereto. In other embodiments, the display device DD may include a liquid crystal display device ("LCD"), a field emission display device ("FED"), a plasma display device ("PDP"), an electrophoretic image display device ("EPD"), an inorganic light-emitting display device ("ILED"), or a quantum dot display device.

Figure 6:
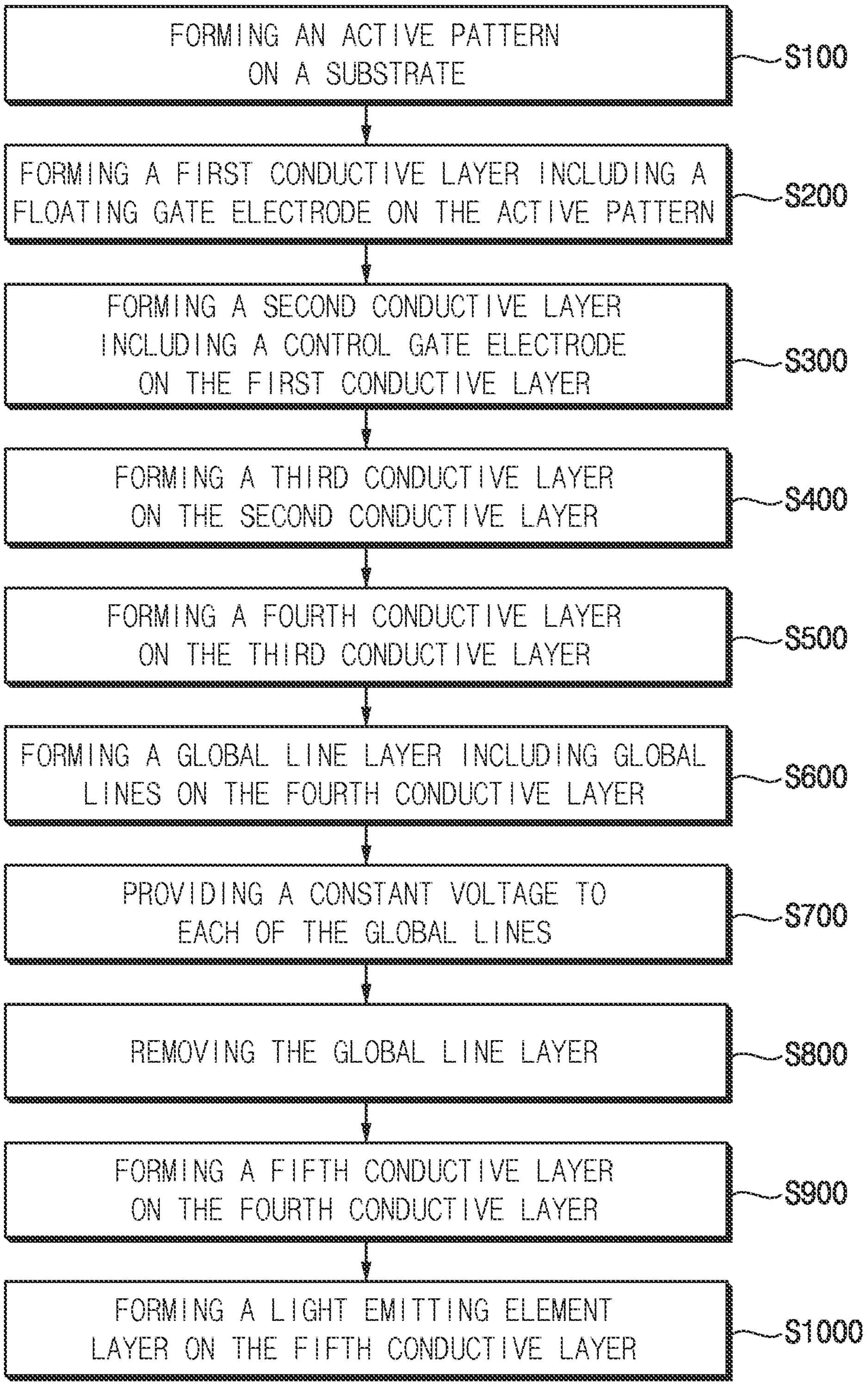
FIG. 6 is a flowchart of a method of manufacturing an embodiment of a display device according to the disclosure.

FIG. 6 is a flowchart of an embodiment of a method of manufacturing a display device according to the disclosure.

Referring to FIG. 6, a method of manufacturing a display device in an embodiment of the disclosure may include forming an active pattern on a substrate (S100), forming a first conductive layer including a floating gate electrode on the active pattern (S200), forming a second conductive layer including a control gate electrode on the first conductive layer (S300), forming a third conductive layer on the second conductive layer (S400), forming a fourth conductive layer on the third conductive layer (S500), forming a global line layer including global lines on the fourth conductive layer (S600), providing a constant voltage to each of the global lines (S700), removing the global line layer (S800), forming a fifth conductive layer on the fourth conductive layer (S900), and forming a light-emitting element layer on the fifth conductive layer (S1000).

Figure 7A:
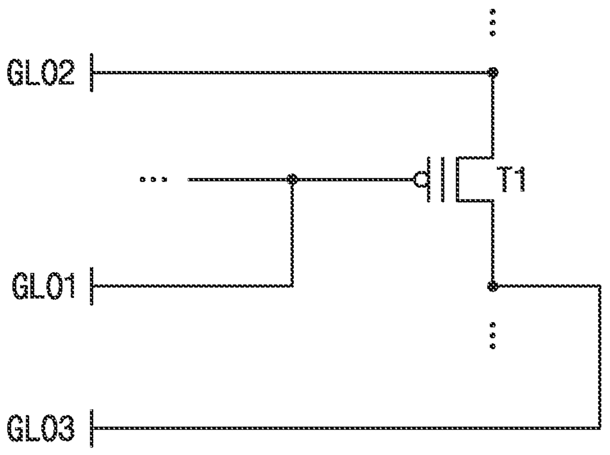
FIGS. 7A and 7B are circuit diagrams for describing the method of manufacturing the display device of FIG. 6.
Figure 7B:
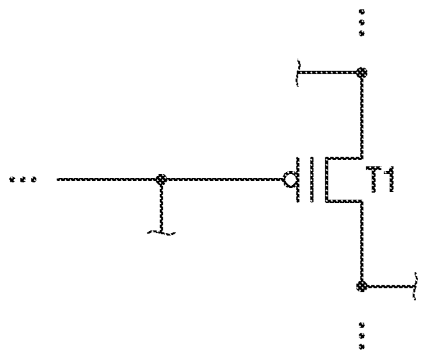

FIGS. 7A and 7B are circuit diagrams for describing the method of manufacturing the display device of FIG. 6. In an embodiment, FIGS. 7A and 7B are circuit diagrams for describing the forming a global line layer including global lines (S600), the providing a constant voltage to each of the global lines (S700), and the removing the global line layer (S800), for example.

Referring to FIGS. 6 and 7A, in the forming a global line layer including global lines (S600), global lines GLO1, GLO2, and GLO3 connected to the first transistor T1 may be formed. Specifically, a first global line GLO1 connected to the gate electrode of the first transistor T1 may be formed. A second global line GLO2 connected to the first electrode of the first transistor T1 may be formed. A third global line GLO3 connected to the second electrode of the first transistor T1 may be formed.

In the providing a constant voltage to each of the global lines (S700), a first constant voltage may be provided to the first global line GLO1 and a second constant voltage may be provided to the second global line GLO2, and a third constant voltage may be provided to the third global line GLO3. The first constant voltage may be transferred to the gate electrode of the first transistor T1 through the first global line GLO1. The second constant voltage may be transferred to the first electrode of the first transistor T1 through the second global line GLO2. The third constant voltage may be transferred to the second electrode of the first transistor T1 through the third global line GLO3.

In other words, separate global lines GLO1, GLO2, and GLO3 may be formed to compensate for the threshold voltage of the first transistor T1. A relatively high voltage (e.g., about −90V) to compensate for the threshold voltage may be provided to the gate electrode of the first transistor T1 through the global lines GLO1, GLO2, and GLO3.

Accordingly, a problem in which the light-emitting element and other transistors may be damaged when the relatively high voltage is provided to the gate electrode of the first transistor T1 may be improved. A detailed description thereof will be described later with reference to FIG. 13.

Referring to FIGS. 6 and 7B, in the removing of the global line layer (S800), the global lines GLO1, GLO2, and GLO3 connected to the first transistor T1 may be removed. That is, the global lines GLO1, GLO2, and GLO3 may be removed so that the pixels that share the global lines GLO1, GLO2, and GLO3 may be individually driven.

As illustrated in FIG. 7A, the first global line GLO1 connected to the gate electrode of the first transistor T1, the second global line GLO2 connected to the first electrode of the first transistor T1, and the third global line GLO3 connected to the second electrode of the first transistor T1 may be formed. However, embodiments of the disclosure are not limited thereto.

In an embodiment, only the first global line GLO1 connected to the gate electrode of the first transistor T1 may be formed, for example. In this case, the second constant voltage may be provided to the first electrode of the first transistor T1 through another component included in the pixel. In addition, the third constant voltage may be provided to the second electrode of the first transistor T1 through still another component included in the pixel.

In another embodiment, the first global line GLO1 connected to the gate electrode of the first transistor T1 and the second global line GLO2 connected to the first electrode of the first transistor T1 may be formed. In this case, the third constant voltage may be provided to the second electrode of the first transistor T1 through another component included in the pixel.

For still another example, the first global line GLO1 connected to the gate electrode of the first transistor T1 and the third global line GLO3 connected to the second electrode of the first transistor T1 may be formed. In this case, the second constant voltage may be provided to the first electrode of the first transistor T1 through another component included in the pixel.

Figure 12:
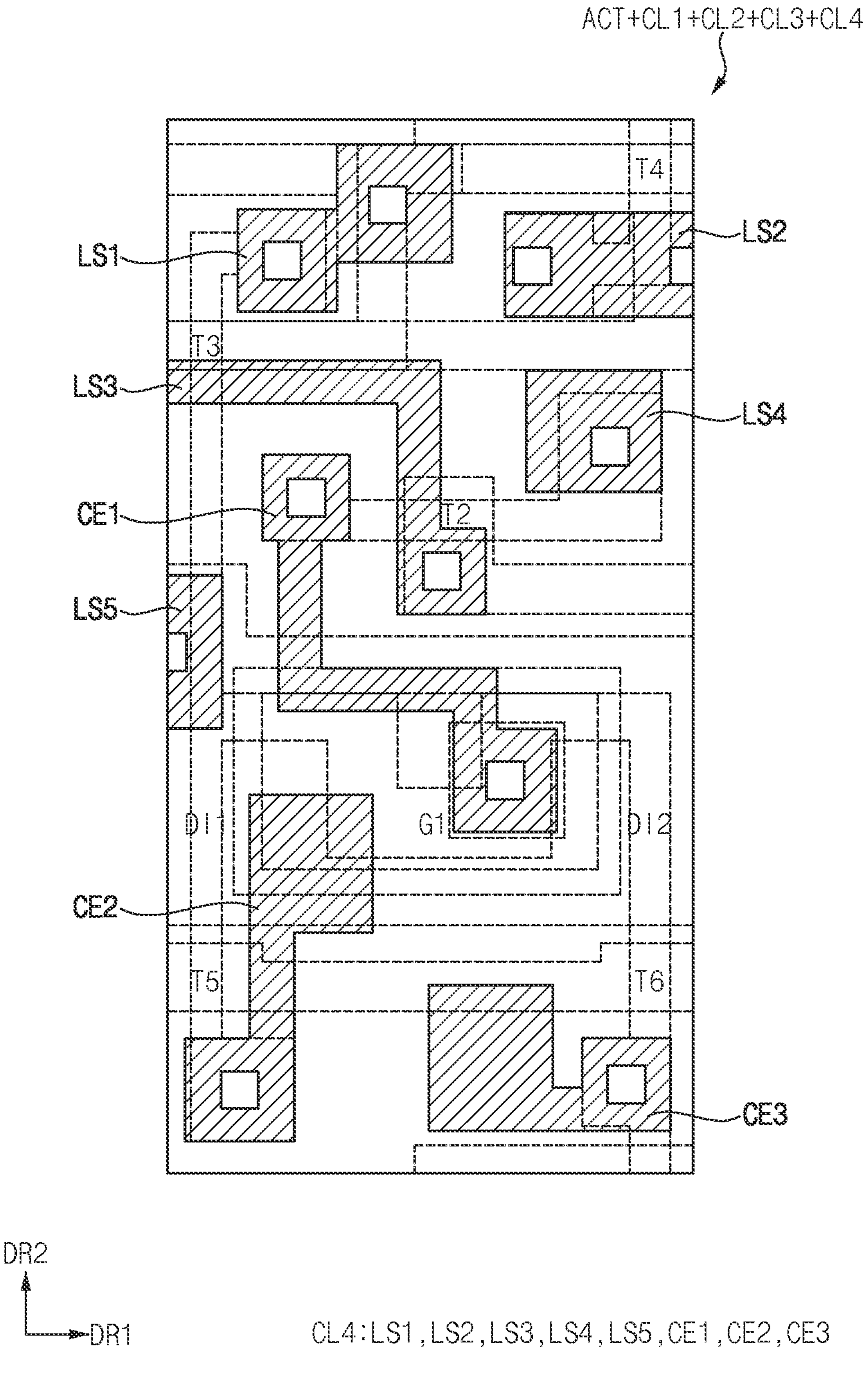
Figure 13:
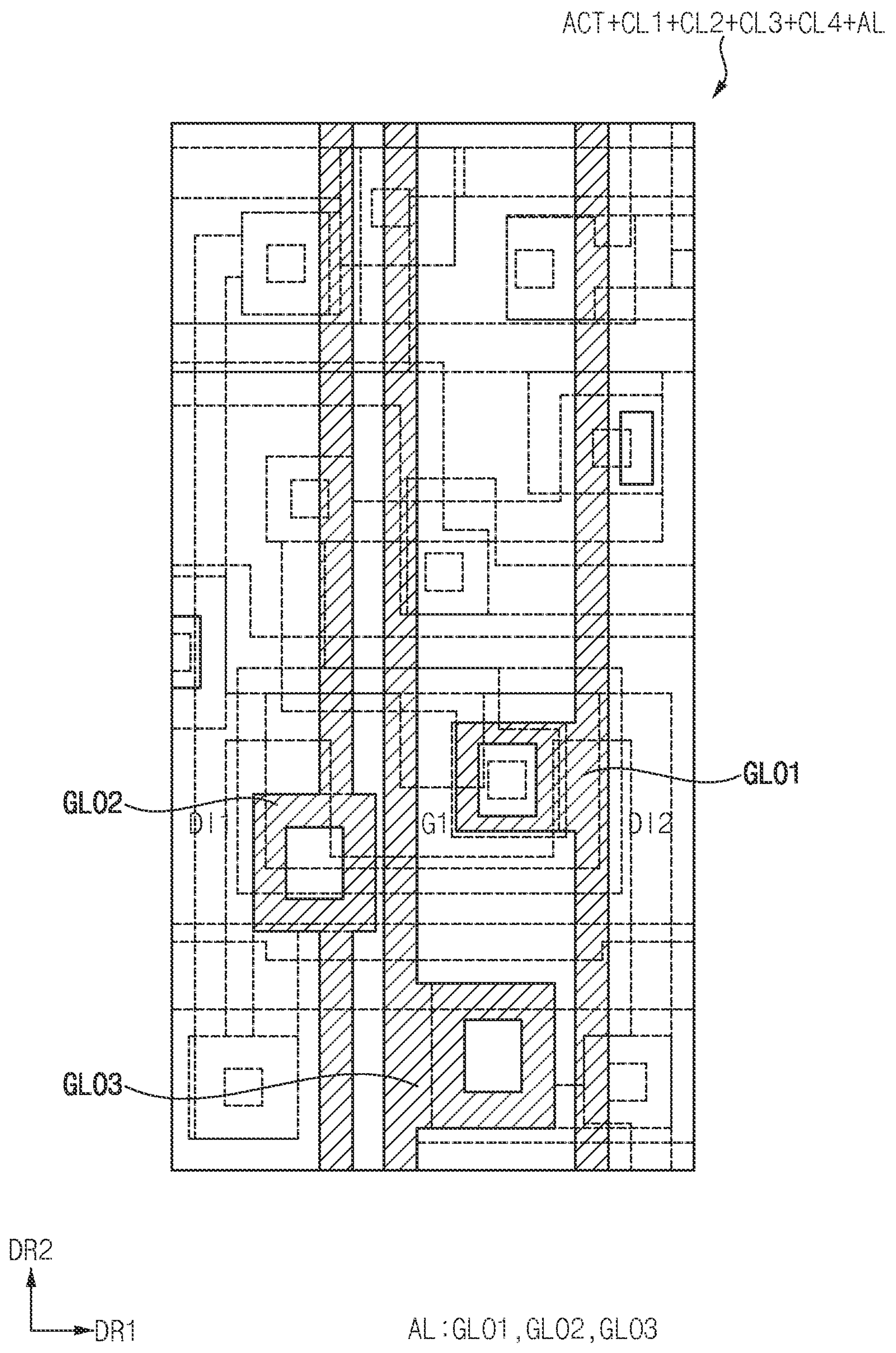
Figure 14:
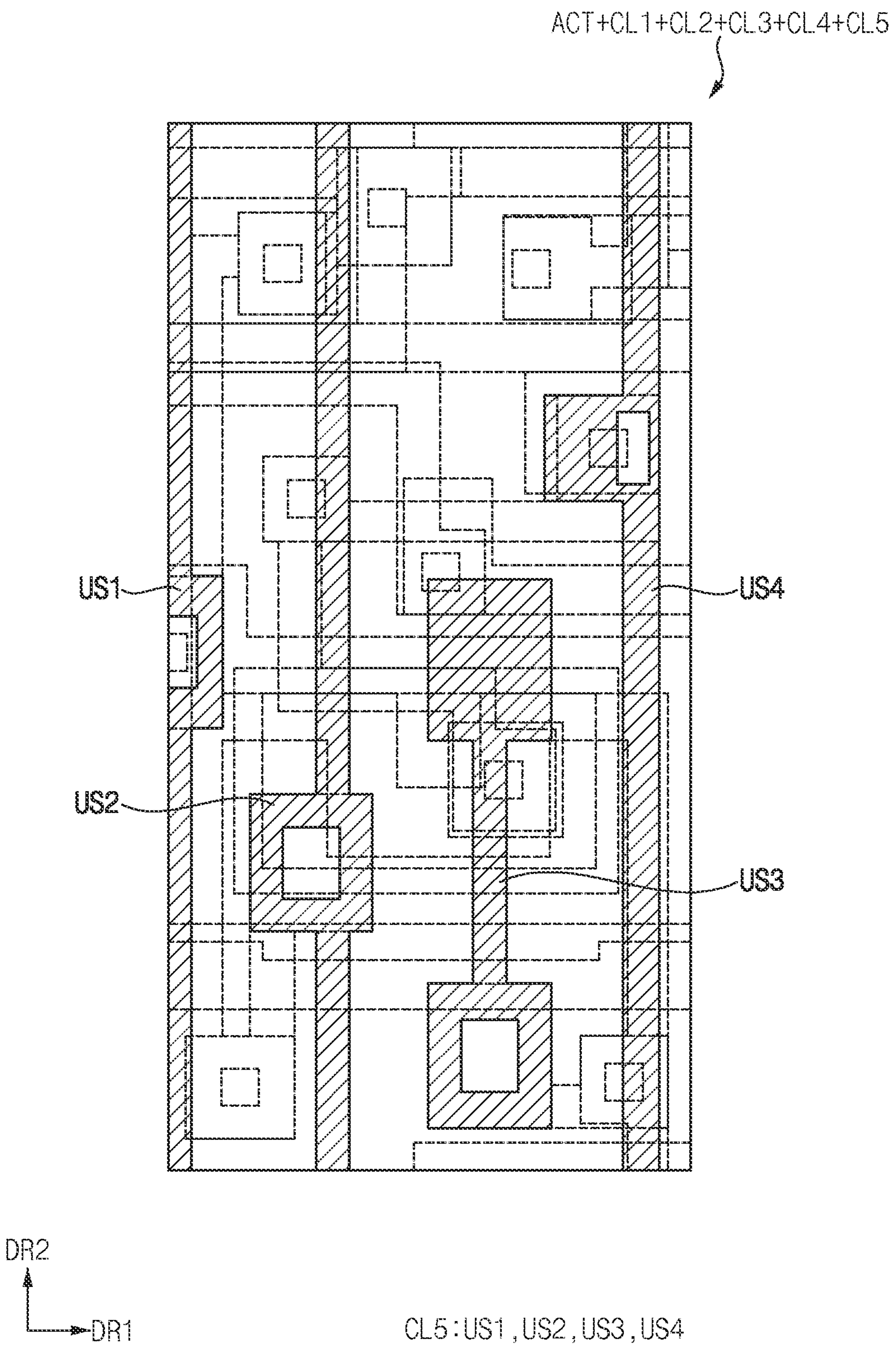

FIGS. 8, 9, 10, 11, 12, 13, and 14 are diagrams for describing the method of manufacturing the display device of FIG. 6. In an embodiment, FIG. 14 is a diagram illustrating an embodiment of the circuit layer CL of FIG. 5, for example. At least some of the components illustrated in FIGS. 8, 9, 10, 11, 12, 13, and 14 may be connected to a plurality of pixel circuits.

Figure 8:
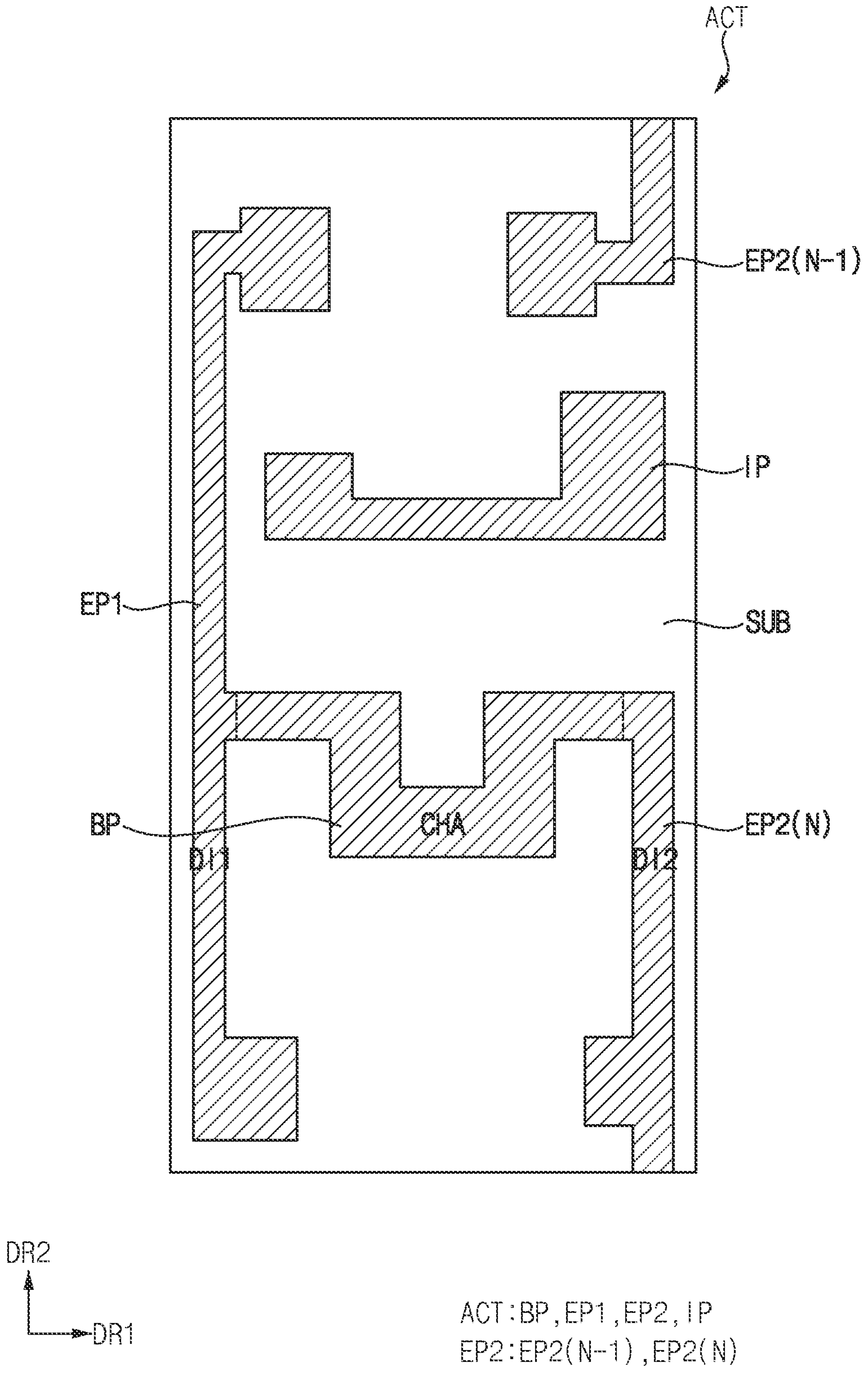
FIGS. 8, 9, 10, 11, 12, 13, and 14 are diagrams for describing the method of manufacturing the display device of FIG. 6.

Referring to FIGS. 6 and 8, an active pattern ACT may be formed on a substrate SUB (S100).

The active pattern ACT may include a body portion BP, a first extension portion EP1, a second extension portion EP2, and an independent portion IP. The body portion BP, the first extension portion EP1, the second extension portion EP2, and the independent portion IP may be disposed in the same layer and may include the same material. In an embodiment, the first extension portion EP1 may be connected to the body portion BP and may be adjacent to the body portion BP in the first direction DR1, for example. The first extension portion EP1 may be spaced apart from the second extension portion EP2 with the body portion BP interposed therebetween. The independent portion IP may be spaced apart from each of the body portion BP, the first extension portion EP1, and the second extension portion EP2.

The second extension portion EP2 may include a second extension portion of a (N−1)-th row EP2(N−1), a second extension portion of a N-th row EP2(N), etc. Although not illustrated in FIG. 8, a portion having substantially the same shape as that of the second extension portion of the N-th row EP2(N) may be adjacent to the second extension portion of the (N−1)-th row EP2(N−1) in the second direction DR2. Similarly, a portion having substantially the same shape as that of the second extension portion of the (N−1)-th row EP2(N−1) may be adjacent to the second extension portion of the N-th row EP2(N) in the second direction DR2.

A part of the first extension portion EP1 may correspond to the first conductor area (e.g., the first conductor area DI1 of FIG. 4) of the first transistor (e.g., the first transistor T1 of FIG. 4). A part of the second extension portion of the N-th row EP2(N) may correspond to the second conductor area (e.g., the second conductor area DI2 of FIG. 4) of the first transistor. In addition, a part of the body portion BP may correspond to the semiconductor area (e.g., the semiconductor area CHA of FIG. 4) of the first transistor.

In an embodiment, the active pattern ACT may include a silicon semiconductor material. In embodiments, silicon semiconductor material that may be used as the active pattern ACT may include amorphous silicon, polycrystalline silicon, etc.

Figure 9:
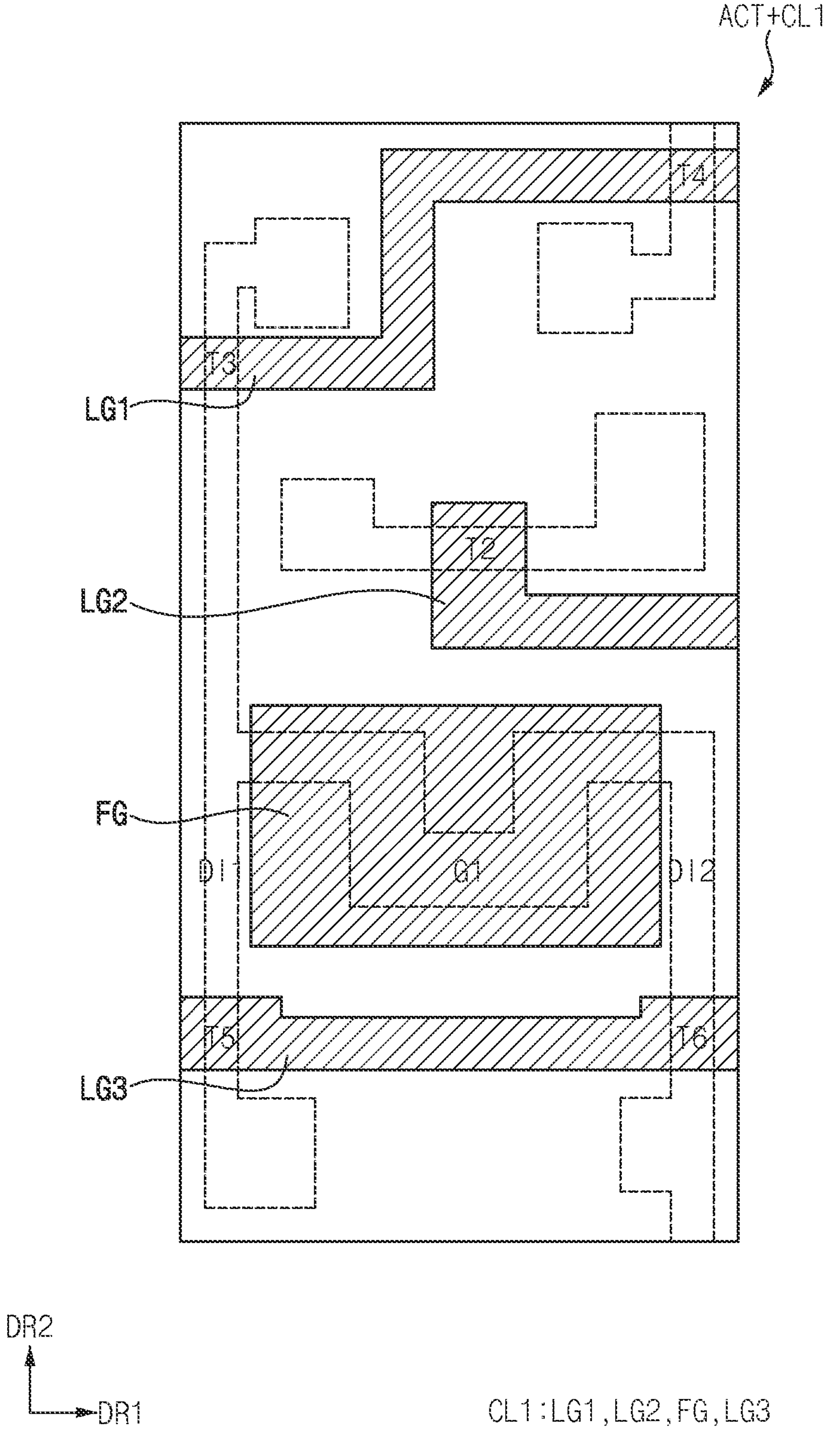

Referring further to FIG. 9, a first gate insulating layer may be formed on the active pattern ACT. The first gate insulating layer may be formed to cover the active pattern ACT.

The first gate insulating layer may include an inorganic insulating material. In embodiments, inorganic insulating material that may be used as the first gate insulating layer may include silicon oxide, silicon nitride, silicon oxynitride, etc. These may be used alone or in any combinations with each other.

A first conductive layer CL1 may be formed on the active pattern ACT (S200). Specifically, the first conductive layer CL1 may be formed on the first gate insulating layer. The first conductive layer CL1 may include a first lower gate pattern LG1, a second lower gate pattern LG2, a third lower gate pattern LG3, and a floating gate electrode FG. The first to third lower gate patterns LG1, LG2, and LG3 and the floating gate electrode FG may be disposed in the same layer and may include the same material. The first conductive layer CL1 may include a metal, an alloy, a metal nitride, a conductive metal oxide, a transparent conductive material, etc. These may be used alone or in any combinations with each other.

The first conductive layer CL1 may at least partially overlap the active pattern ACT. An overlapping part between the first conductive layer CL1 and the active pattern ACT may configure a part of a transistor.

The first lower gate pattern LG1 may extend in the first direction DR1. A first part of the first lower gate pattern LG1 overlapping the first extension portion EP1 of the active pattern ACT may configure the gate electrode of the third transistor T3. A second part of the first lower gate pattern LG1 overlapping the second extension portion of the (N−1)-th row EP2(N−1) of the active pattern ACT may configure the gate electrode of the fourth transistor T4. In an embodiment, when a pixel (e.g., the pixel PX of FIG. 1) is included in an N-th pixel row, the second part of the first lower gate pattern LG1 may configure the gate electrode of the fourth transistor T4 of a pixel included in an (N−1)-th pixel row. The bias gate signal (e.g., the bias gate signal GB of FIG. 3) may be provided to the first lower gate pattern LG1.

The second lower gate pattern LG2 may be spaced apart from the first lower gate pattern LG1 in the second direction DR2. A part of the second lower gate pattern LG2 overlapping the independent portion IP of the active pattern ACT may configure the gate electrode of the second transistor T2. The write gate signal (e.g., the write gate signal GW of FIG. 3) may be provided to the second gate lower pattern LG2.

The floating gate electrode FG may be spaced apart from the second lower gate pattern LG2 in the second direction DR2. The floating gate electrode FG may have an island shape in a plan view.

The floating gate electrode FG overlapping the body portion BP of the active pattern ACT may configure the gate electrode of the first transistor T1. That is, the floating gate electrode FG may correspond to the floating gate electrode FG of FIG. 4.

The third lower gate pattern LG3 may extend in the first direction DR1 and spaced apart from the floating gate electrode FG in the second direction DR2. A first part of the third lower gate pattern LG3 overlapping the first extending portion EP1 of the active pattern ACT may configure the gate electrode of the fifth transistor T5. A second part of the third lower gate pattern LG3 overlapping the second extending portion of the N-th row EP2(N) of the active pattern ACT may configure the gate electrode of the sixth transistor T6. The light-emitting control signal (e.g., the light-emitting control signal EM of FIG. 3) may be provided to the third lower gate pattern LG3.

Figure 10:
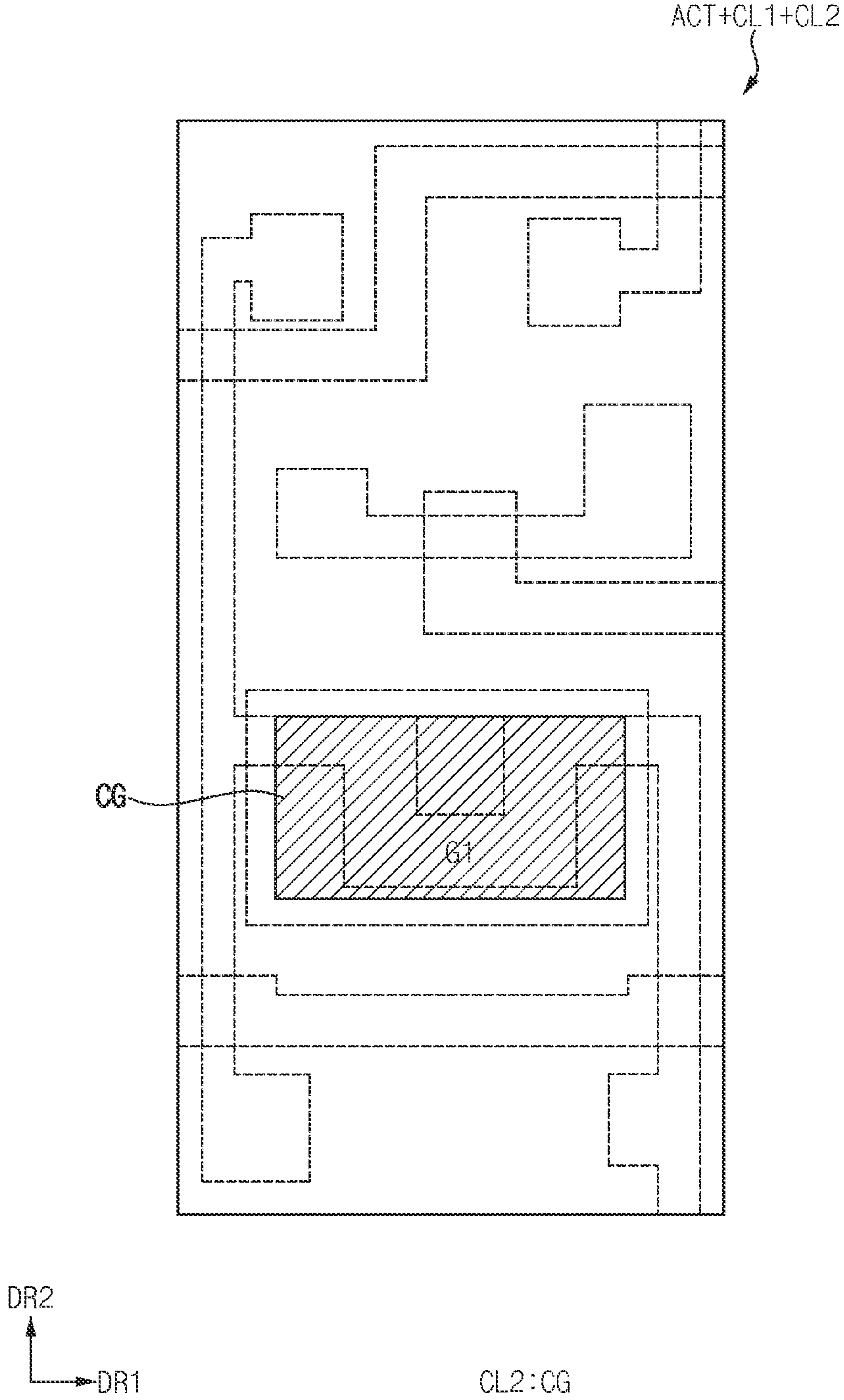

Referring further to FIG. 10, a second gate insulating layer may be formed on the first conductive layer CL1. The second gate insulating layer may be formed to cover the first conductive layer CL1.

The second gate insulating layer may include an inorganic insulating material. In embodiments, inorganic insulating material that may be used as the second gate insulating layer may include silicon oxide, silicon nitride, silicon oxynitride, etc. These may be used alone or in any combinations with each other. In an embodiment, the second gate insulating layer may include a plurality of insulating layers. In an embodiment, the second gate insulating layer may include an O—N—O layer, for example.

A second conductive layer CL2 may be formed on the first conductive layer CL1 (S300). Specifically, the second conductive layer CL2 may be formed on the second gate insulating layer. The second conductive layer CL2 may include a control gate electrode CG. The second conductive layer CL2 may include a metal, an alloy, a metal nitride, a conductive metal oxide, a transparent conductive material, etc. These may be used alone or in any combinations with each other.

The control gate electrode CG may have an island shape in a plan view. The control gate electrode CG may partially overlap the floating gate electrode FG. The control gate electrode CG overlapping the floating gate electrode FG may configure the gate electrode of the first transistor T1. That is, the control gate electrode CG may correspond to the control gate electrode CG of FIG. 4.

Figure 11:
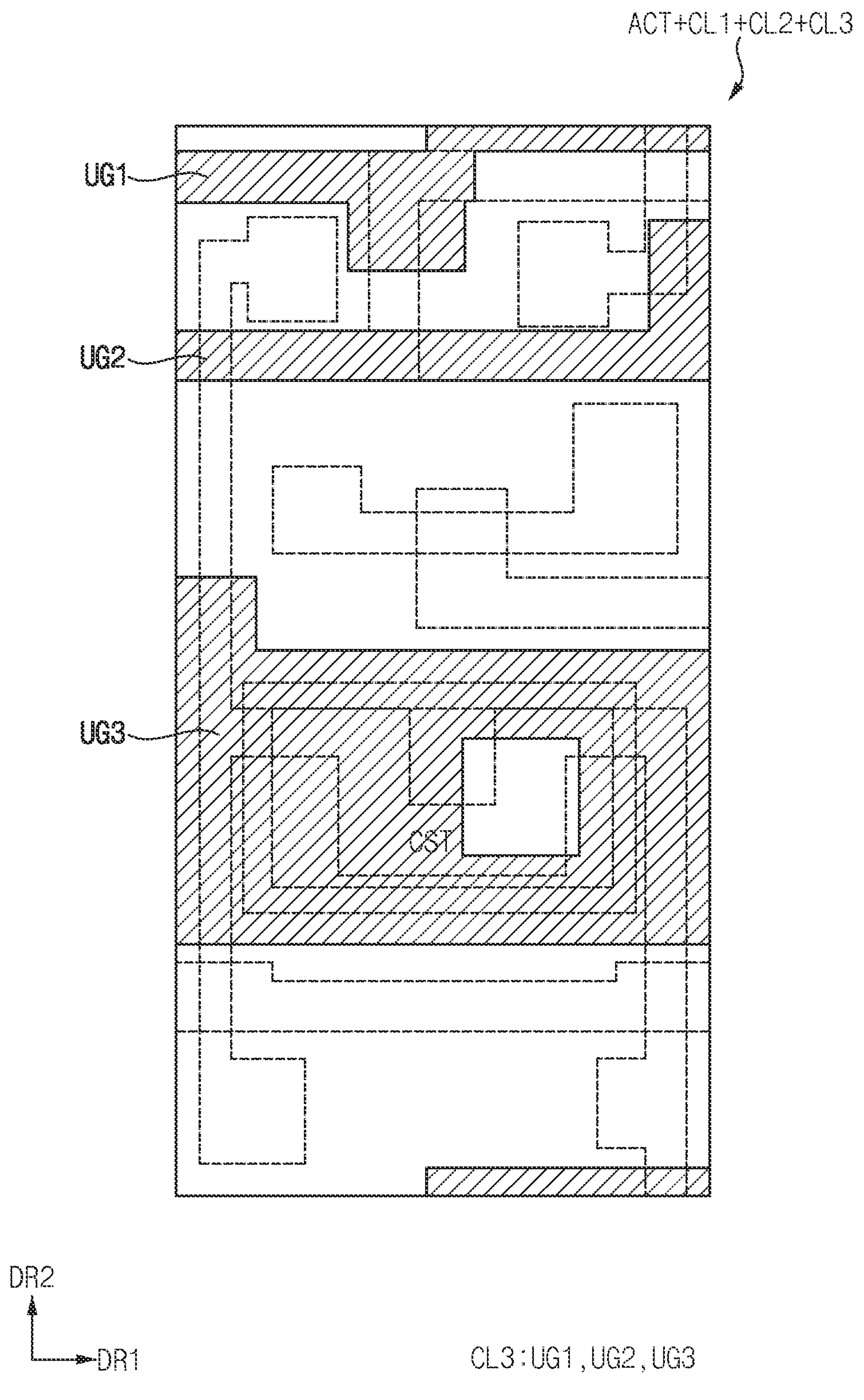

Referring further to FIG. 11, a third gate insulating layer may be formed on the second conductive layer CL2. The third gate insulating layer may be formed to cover the second conductive layer CL2.

The third gate insulating layer may include an inorganic insulating material. In embodiments, inorganic insulating material that may be used as the third gate insulating layer may include silicon oxide, silicon nitride, silicon oxynitride, etc. These may be used alone or in any combinations with each other.

A third conductive layer CL3 may be formed on the second conductive layer CL2 (S400). Specifically, the third conductive layer CL3 may be formed on the third gate insulating layer. The third conductive layer CL3 may include a first upper gate pattern UG1, a second upper gate pattern UG2, and a third upper gate pattern UG3. The first to third upper gate patterns UG1, UG2, and UG3 may be disposed in the same layer and may include the same material. The third conductive layer CL3 may include a metal, an alloy, a metal nitride, a conductive metal oxide, a transparent conductive material, etc. These may be used alone or in any combinations with each other.

The first upper gate pattern UG1 may extend in the first direction DR1. The bias voltage (e.g., the bias voltage VBIAS of FIG. 3) may be provided to the first upper gate pattern UG1. The first upper gate pattern UG1 may be also referred to as a bias voltage line.

The second upper gate pattern UG2 may extend in the first direction DR1 and may be spaced apart from the first upper gate pattern UG1 in the second direction DR2. The anode initialization voltage (e.g., the anode initialization voltage VAINT of FIG. 3) may be provided to the second upper gate pattern UG2. The second upper gate pattern UG2 may be also referred to as an anode initialization voltage line.

The third upper gate pattern UG3 may be spaced apart from the second upper gate pattern UG2 in the second direction DR2. The third upper gate pattern UG3 may overlap the control gate electrode CG in a plan view. That is, in an area where the control gate electrode CG and the third upper gate pattern UG3 overlap, the control gate electrode CG and the third upper gate pattern UG3 may form the storage capacitor CST. In an embodiment, an opening exposing an upper surface of the control gate electrode CG may be defined in the third upper gate pattern UG3.

Referring further to FIGS. 12 and 13, an inter-insulating layer may be formed on the third conductive layer CL3 and may cover the third conductive layer CL3.

The inter-insulating layer may include an inorganic insulating material. In embodiments, inorganic insulating material that may be used as the inter-insulating layer may include silicon oxide, silicon nitride, silicon oxynitride, etc. These may be used alone or in any combinations with each other.

A fourth conductive layer CL4 may be formed on the third conductive layer CL3 (S500). Specifically, the fourth conductive layer CL4 may be formed on the inter-insulating layer. The fourth conductive layer CL4 may include first to fifth lower source patterns LS1, LS2, LS3, LS4, and LS5 and first to third connection electrodes CE1, CE2, and CE3. The first to fifth lower source patterns LS1, LS2, LS3, LS4, and LS5 and the first to third connection electrodes CE1, CE2, and CE3 may be disposed in the same layer and may include the same material. The fourth conductive layer CL4 may include a metal, an alloy, a metal nitride, a conductive metal oxide, a transparent conductive material, etc. These may be used alone or in any combinations with each other.

The bias voltage may be provided to the first lower source pattern LS1. The first lower source pattern LS1 may be connected to each of the first extension portion EP1 of the active pattern ACT and the first upper gate pattern UG1 through a contact hole. Accordingly, the bias voltage may be provided to the third transistor T3. The first lower source pattern LS1 may be also referred to as a bias voltage connection electrode.

The second lower source pattern LS2 may be spaced apart from the first lower source pattern LS1. The anode initialization voltage may be provided to the second lower source pattern LS2. The second lower source pattern LS2 may be connected to each of the second extension portion of the (N−1)-th row EP2(N−1) of the active pattern ACT and the second upper gate pattern UG2 through a contact hole. Accordingly, the anode initialization voltage may be provided to the fourth transistor T4 of a pixel included in the (N−1)-th pixel row. The second lower source pattern LS2 may be also referred to as an anode initialization voltage connection electrode.

The third lower source pattern LS3 may be spaced apart from the second lower source pattern LS2. The write gate signal may be provided to the third lower source pattern LS3. The third lower source pattern LS3 may be connected to the second lower gate pattern LG2 through a contact hole. Accordingly, the write gate signal may be provided to the gate electrode of the second transistor T2. The third lower source pattern LS3 may be also referred to as a write gate line.

The fourth lower source pattern LS4 may be spaced apart from the third lower source pattern LS3. The data voltage (e.g., the data voltage VDATA of FIG. 3) may be provided to the fourth lower source pattern LS4. The fourth lower source pattern LS4 may be connected to the independent portion IP of the active pattern ACT through a contact hole. Accordingly, the data voltage may be provided to the second transistor T2. The fourth lower source pattern LS4 may be also referred to as a data voltage connection electrode.

The fifth lower source pattern LS5 may be spaced apart from the fourth lower source pattern LS4. The first driving voltage (e.g., the first driving voltage ELVDD1 of FIG. 3) may be provided to the fifth lower source pattern LS5. The fifth lower source pattern LS5 may be connected to the third upper gate pattern UG3 through a contact hole. Accordingly, the first driving voltage may be provided to the storage capacitor CST. The fifth lower source pattern LS5 may be also referred to as a first driving voltage connection electrode.

The first connection electrode CE1 may be spaced apart from the fifth lower source pattern LS5. The first connection electrode CE1 may be connected to the independent portion IP of the active pattern ACT through a contact hole. In addition, the first connection electrode CE1 may be connected to the control gate electrode CG through a contact hole and the opening defined by the third upper gate pattern UG3. Accordingly, the first connection electrode CE1 may electrically connect the first transistor T1 and the second transistor T2. In an embodiment, the first connection electrode CE1 may partially overlap a first global line GLO1 to be described later.

The second connection electrode CE2 may be spaced apart from the first connection electrode CE1. The second connection electrode CE2 may be connected to the first extension portion EP1 of the active pattern ACT through a contact hole. The second driving voltage (e.g., the second driving voltage ELVDD2 of FIG. 3) may be provided to the second connection electrode CE2. Accordingly, the second driving voltage may be provided to the fifth transistor T5. The second connection electrode CE2 may be also referred to as a second driving voltage connection electrode. In an embodiment, the second connection electrode CE2 may partially overlap a second global line GLO2 to be described later.

The third connection electrode CE3 may be spaced apart from the second connection electrode CE2. The third connection electrode CE3 may be connected to the second extension portion of the N-th row EP2(N) of the active pattern ACT through a contact hole. The third connection electrode CE3 may provide the anode initialization voltage or the driving current to the light-emitting element (e.g., the light-emitting element LD of FIG. 3). The third connection electrode CE3 may be also referred to as a first light-emitting element connection electrode. In an embodiment, the third connection electrode CE3 may partially overlap a third global line GLO3 to be described later.

A first via-insulating layer may be formed on the fourth conductive layer CL4. The first via-insulating layer may be formed to cover the fourth conductive layer CL4.

The first via-insulating layer may include an organic insulating material. In embodiments, organic insulating material that may be used as the first via-insulating layer may include photoresist, polyacryl-based resin, polyimide-based resin, acryl-based resin, etc. These may be used alone or in any combinations with each other.

A global line layer AL may be formed on the fourth conductive layer CL4 (S600). Specifically, the global line layer AL may be formed on the first via-insulating layer. The global line layer AL may include the first global line GLO1, the second global line GLO2, and the third global line GLO3. The first to third global lines GLO1, GLO2, and GLO3 may be disposed in the same layer and may include the same material. The global line layer AL may include a metal, an alloy, a metal nitride, a conductive metal oxide, a transparent conductive material, etc. These may be used alone or in any combinations with each other.

The first global line GLO1 may extend in the second direction DR2. The first global line GLO1 may be connected to the first connection electrode CE1 through a contact hole.

The second global line GLO2 may extend in the second direction DR2 and may be spaced apart from the first global line GLO1 in the first direction DR1. The second global line GLO2 may be connected to the second connection electrode CE2 through a contact hole.

The third global line GLO3 may extend in the second direction DR2 and may be spaced apart from the second global line GLO2 in the first direction DR1. The third global line GLO3 may be connected to the third connection electrode CE3 through a contact hole.

A constant voltage may be provided to each of the global lines GLO1, GLO2 and GLO3 (S700).

A first constant voltage may be provided to the first global line GLO1. Accordingly, the first constant voltage may be provided to the control gate electrode CG through the first connection electrode CE1.

A second constant voltage may be provided to the second global line GLO2. Accordingly, the second constant voltage may be provided to the first extension portion EP1 of the active pattern ACT through the second connection electrode CE2. A part of the first extension portion EP1 may correspond to the first conductor area DI1 of the first transistor T1. That is, the second constant voltage may be provided to the first conductor area DI1 of the first transistor T1 through the second connection electrode CE2.

A third constant voltage may be provided to the third global line GLO3. Accordingly, the third constant voltage may be provided to the second extension portion of the N-th row EP2(N) of the active pattern ACT through the third connection electrode CE3. A part of the second extension portion of the N-th row EP2(N) may correspond to the second conductor area DI2 of the first transistor T1. That is, the third constant voltage may be provided to the second conductor area DI2 of the first transistor T1 through the third connection electrode CE3.

The providing a constant voltage to each of the global lines GLO1, GLO2 and GLO3 (S700) may include a first voltage providing operation and a second voltage providing operation.

In the first voltage providing operation, the first constant voltage may have a low level voltage, and the second constant voltage may have a voltage higher than the first constant voltage. In an embodiment, the first constant voltage may have a value of about −84V, the second constant voltage may have a value of about 0V, and the third constant voltage may have a value of about −0.1V, for example. That is, a voltage difference between the control gate electrode CG and the first conductor area DI1 may be about −84V. In this case, the threshold voltage of the first transistor T1 may be decreased.

Specifically, since the global lines GLO1, GLO2 and GLO3 extend in the second direction DR2 and are connected to each of pixels included in the M-th pixel column, the threshold voltages of the first transistors T1 included in the pixels included in the M-th pixel column may be collectively decreased.

In the second voltage providing operation, the first constant voltage may have a high level voltage, and the second constant voltage may have a voltage lower than the first constant voltage. In an embodiment, the first constant voltage may have a value of about 42V, the second constant voltage may have a value of about 0V, and the third constant voltage may have a value of about −0.1V. In this case, the threshold voltage of the first transistor T1 may be increased, for example.

Specifically, since the global lines GLO1, GLO2, and GLO3 extend in the second direction DR2 and are connected to each of the pixels included in the M-th pixel column, the threshold voltages of the first transistors T1 included in the pixels included in the M-th pixel column may be collectively increased.

That is, as the threshold voltages of the first transistors T1 included in the pixels are collectively decreased and increased, the threshold voltage distribution of the first transistor T1 for each pixel may be decreased.

In an embodiment, an absolute value of a difference between the first constant voltage and the second constant voltage may be greater than or equal to about 80V and less than or equal to about 100V. In addition, an absolute value of a difference between the second constant voltage and the third constant voltage may be greater than or equal to about 0V and less than or equal to about 0.2V.

In an embodiment, the second constant voltage and the third constant voltage in the second voltage providing operation may be the same as the second constant voltage and the third constant voltage in the first voltage providing operation, respectively. In another embodiment, the second constant voltage and the third constant voltage in the second voltage providing operation may be different from the second constant voltage and the third constant voltage in the first voltage providing operation, respectively.

Referring further to FIG. 14, the global line layer AL formed on the first via-insulating layer may be removed (S800). That is, the global line layer AL may be removed so that the pixels included in the M-th pixel column that share the global lines GLO1, GLO2, and GLO3 may be individually driven.

A fifth conductive layer CL5 may be formed on the fourth conductive layer CL4 (S900). Specifically, the fifth conductive layer CL5 may be formed on the first via-insulating layer. The fifth conductive layer CL5 may include a first upper source pattern US1, a second upper source pattern US2, a third upper source pattern US3, and a fourth upper source pattern US4. The first to fourth upper source patterns US1, US2, US3, and US4 may be disposed in the same layer and may include the same material. The fifth conductive layer CL5 may include a metal, an alloy, a metal nitride, a conductive metal oxide, a transparent conductive material, etc. These may be used alone or in any combinations with each other.

The first upper source pattern US1 may extend in the second direction DR2. The first driving voltage may be provided to the first upper source pattern US1. The first upper source pattern US1 may be connected to the fifth lower source pattern LS5 through a contact hole. Accordingly, the first driving voltage may be provided to the fifth lower source pattern LS5. The first upper source pattern US1 may be also referred to as a first driving voltage line.

The second upper source pattern US2 may extend in the second direction DR2 and may be spaced apart from the first upper source pattern US1 in the first direction DR1. The second driving voltage may be provided to the second upper source pattern US2. The second upper source pattern US2 may be connected to the second connection electrode CE2 through a contact hole. Accordingly, the second driving voltage may be provided to the second connection electrode CE2. The second upper source pattern US2 may be also referred to as a second driving voltage line.

The third upper source pattern US3 may be spaced apart from the second upper source pattern US2 in the first direction DR1. The third upper source pattern US3 may be connected to the third connection electrode CE3 through a contact hole. The third upper source pattern US3 may provide the anode initialization voltage or the driving current to the light-emitting element. The third upper source pattern US3 may be also referred to as a second light-emitting element connection electrode.

The fourth upper source pattern US4 may be extend in the second direction DR2 and may be spaced apart from the third upper source pattern US3 in the first direction DR1. The data voltage may be provided to the fourth upper source pattern US4. The fourth upper source pattern US4 may be connected to the fourth lower source pattern LS4 through a contact hole. Accordingly, the data voltage may be provided to the fourth lower source pattern LS4. The fourth upper source pattern US4 may be also referred to as a data voltage line.

Referring back to FIG. 5, a light-emitting element layer may be formed on the fifth conductive layer CL5 (S1000). The light-emitting element layer may include a second via-insulating layer, the anode electrode PE, the pixel defining layer PDL, the light-emitting layer EL, the cathode electrode CE, and the encapsulation layer TFE.

The second via-insulating layer may be formed on the fifth conductive layer CL5. The second via-insulating layer may be formed to cover the fifth conductive layer CL5.

The second via-insulating layer may include an organic insulating material. In embodiments, organic insulating material that may be used as the second via-insulating layer may include photoresist, polyacryl-based resin, polyimide-based resin, acryl-based resin, etc. These may be used alone or in any combinations with each other.

The anode electrode PE may be formed on the second via-insulating layer. The anode electrode PE may be connected to the third upper source pattern US3 through a contact hole. The anode electrode PE may include a metal, an alloy, a metal nitride, a conductive metal oxide, a transparent conductive material, etc. These may be used alone or in any combinations with each other.

The pixel defining layer PDL may be formed on the second via-insulating layer and the anode electrode PE. An opening exposing at least a part of an upper surface of the anode electrode PE may be defined in the pixel defining layer PDL. The pixel defining layer PDL may include an organic insulating material. In embodiments, organic insulating material that may be used as the pixel defining layer PDL may include photoresist, polyacryl-based resin, polyimide-based resin, acryl-based resin, etc. These may be used alone or in any combinations with each other.

The light-emitting layer EL may be formed on the anode electrode PE. Specifically, the light-emitting layer EL may be formed in the opening of the pixel defining layer PDL. The light-emitting layer EL may include materials for emitting light.

The cathode electrode CE may be formed on the pixel defining layer PDL and the light-emitting layer EL. In an embodiment, the cathode electrode CE may include a metal, an alloy, a metal nitride, a conductive metal oxide, a transparent conductive material, etc., for example. These may be used alone or in any combinations with each other.

The encapsulation layer TFE may be formed on the cathode electrode CE. The encapsulation layer TFE may include at least one inorganic layer and at least one organic layer. In an embodiment, the encapsulation layer TFE may include the first inorganic layer TFE1 disposed on the cathode electrode CE, the organic layer TFE2 disposed on the first inorganic layer TFE1, and the second inorganic layer TFE3 disposed on the organic layer TFE2, for example.

Figure 15:
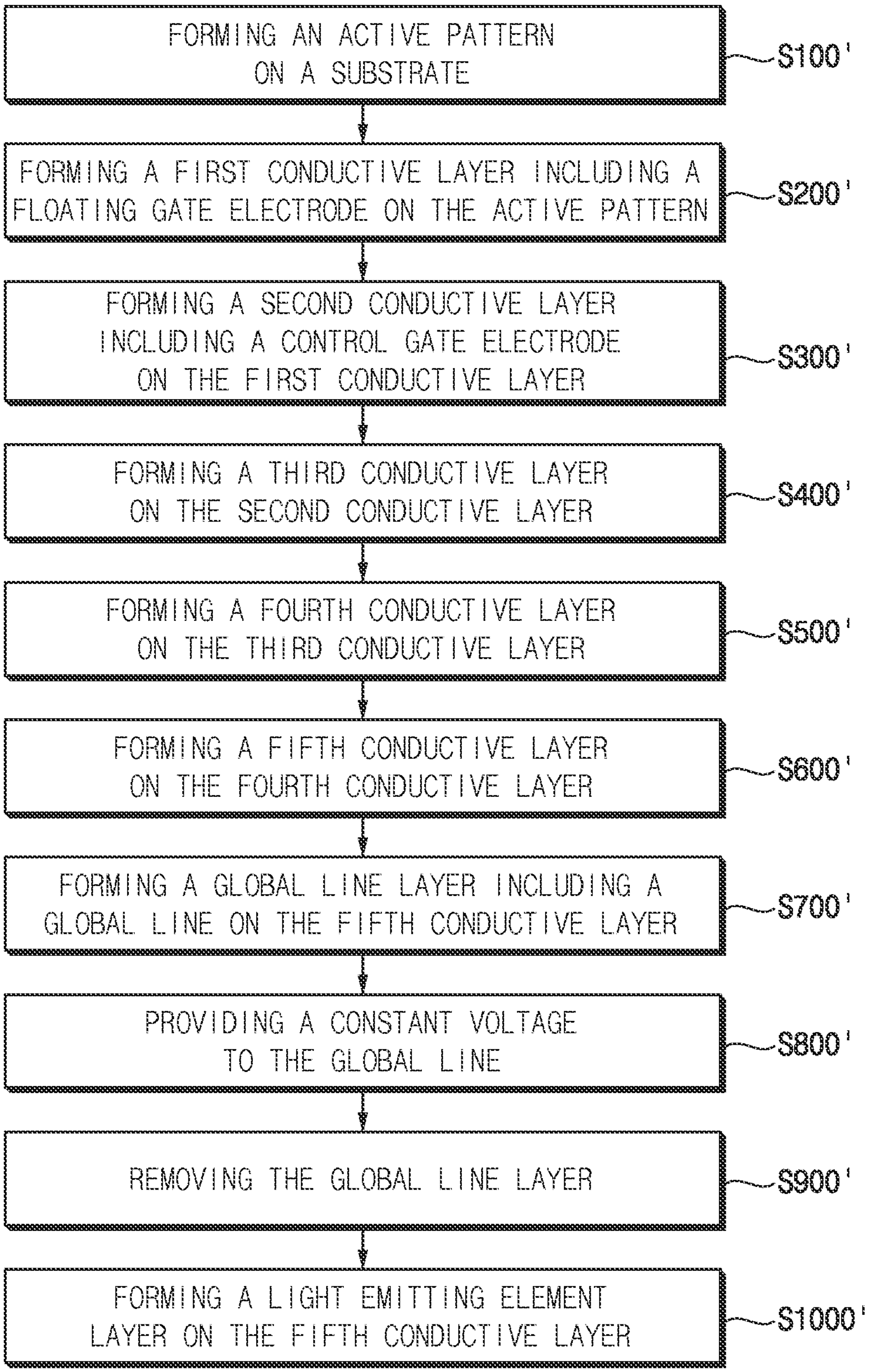
FIG. 15 is a flowchart of a method of manufacturing an embodiment of a display device according to the disclosure.

FIG. 15 is a flowchart of an embodiment of a method of manufacturing a display device according to the disclosure.

Referring to FIG. 15, a method of manufacturing a display device in another embodiment of the disclosure may include forming an active pattern on a substrate (S100'), forming a first conductive layer including a floating gate electrode on the active pattern (S200'), forming a second conductive layer including a control gate electrode on the first conductive layer (S300'), forming a third conductive layer on the second conductive layer (S400'), forming a fourth conductive layer on the third conductive layer (S500'), forming a fifth conductive layer on the fourth conductive layer (S600'), forming a global line layer including a global line on the fifth conductive layer (S700'), providing a constant voltage to the global line (S800'), removing the global line layer (S900'), and forming a light-emitting element layer on the fifth conductive layer (S1000').

The forming an active pattern on a substrate (S100') may be substantially the same as the forming an active pattern on a substrate (S100) described with reference to FIG. 8.

The forming a first conductive layer including a floating gate electrode on the active pattern (S200') may be substantially the same as the forming a first conductive layer including a floating gate electrode on the active pattern (S200) described with reference to FIG. 9.

The forming a second conductive layer including a control gate electrode on the first conductive layer (S300') may be substantially the same as the forming a second conductive layer including a control gate electrode on the first conductive layer (S300) described with reference to FIG. 10.

The forming a third conductive layer on the second conductive layer (S400') may be substantially the same as the forming a third conductive layer on the second conductive layer (S400) described with reference to FIG. 11.

The forming a fourth conductive layer on the third conductive layer (S500') may be substantially the same as the forming a fourth conductive layer on the third conductive layer (S500) described with reference to FIG. 12.

The forming a fifth conductive layer on the fourth conductive layer (S600') may be substantially the same as the forming a fifth conductive layer on the fourth conductive layer (S900) described with reference to FIG. 14.

The forming a light-emitting element layer on the fifth conductive layer (S1000') may be substantially the same as the forming a light-emitting element layer on the fifth conductive layer (S1000) described with reference to FIG. 14. Hereinafter, descriptions overlapping with descriptions of the method of manufacturing the display device in an embodiment of the disclosure described with reference to FIGS. 8, 9, 10, 11, 12, 13, and 14 will be omitted or simplified.

Figure 16A:
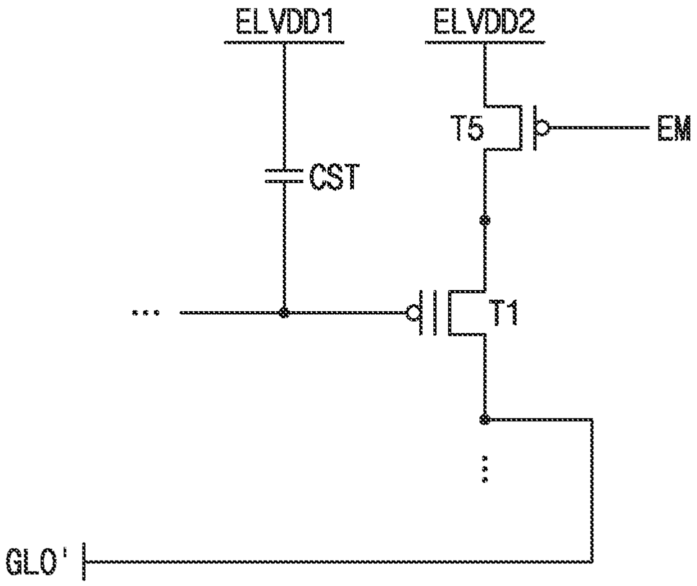
FIGS. 16A and 16B are circuit diagrams for describing the method of manufacturing the display device of FIG. 15.
Figure 16B:
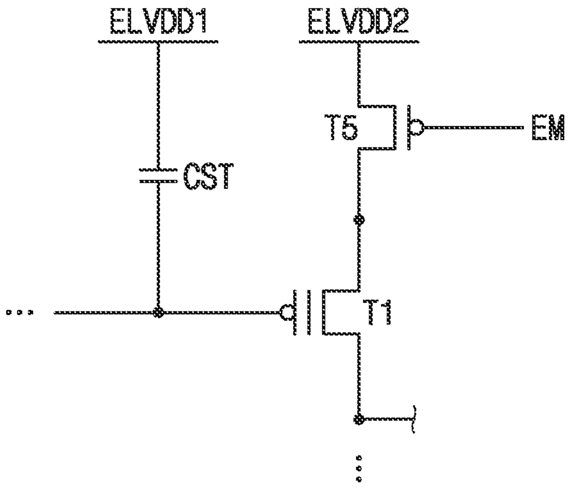

FIGS. 16A and 16B are circuit diagrams for describing the method of manufacturing the display device of FIG. 15. In an embodiment, FIGS. 16A and 16B are circuit diagrams for describing the forming a global line layer including a global line (S700'), the providing a constant voltage to the global line (S800'), and the removing the global line layer (S900'), for example.

Referring to FIGS. 15 and 16A, in the forming a global line layer including a global line (S700'), a global line GLO' connected to the first transistor T1 may be formed. Specifically, the global line GLO' connected to the second electrode of the first transistor T1 may be formed.

In the providing a constant voltage to the global line GLO' (S800'), a first constant voltage may be provided to a first upper source pattern (e.g., a first upper source pattern US1 of FIG. 17), and a second constant voltage may be provided to a second upper source pattern (e.g., a second upper source pattern US2 of FIG. 17), and a third constant voltage may be provided to the global line GLO'. The first constant voltage may be transferred to the gate electrode of the first transistor T1. The second constant voltage may be transferred to the first electrode of the first transistor T1. The third constant voltage may be transferred to the second electrode of the first transistor T1 through the global line GLO'. A detailed description thereof will be described later with reference to FIG. 17.

Referring to FIGS. 15 and 16B, in the removing of the global line layer (S900'), the global line GLO' connected to the first transistor T1 may be removed. That is, the global line GLO' may be removed so that pixels sharing the global line GLO' may be individually driven. In this case, since the first upper source pattern to which the first constant voltage has been provided may provide the first driving voltage ELVDD1 to the storage capacitor CST when the pixels are driven, the first upper source pattern may not be removed. In addition, since the second upper source pattern to which the second constant voltage has been provided may provide the second driving voltage ELVDD2 to the fifth transistor T5 when the pixels are driven, the second upper source pattern may not be removed.

Figure 17:
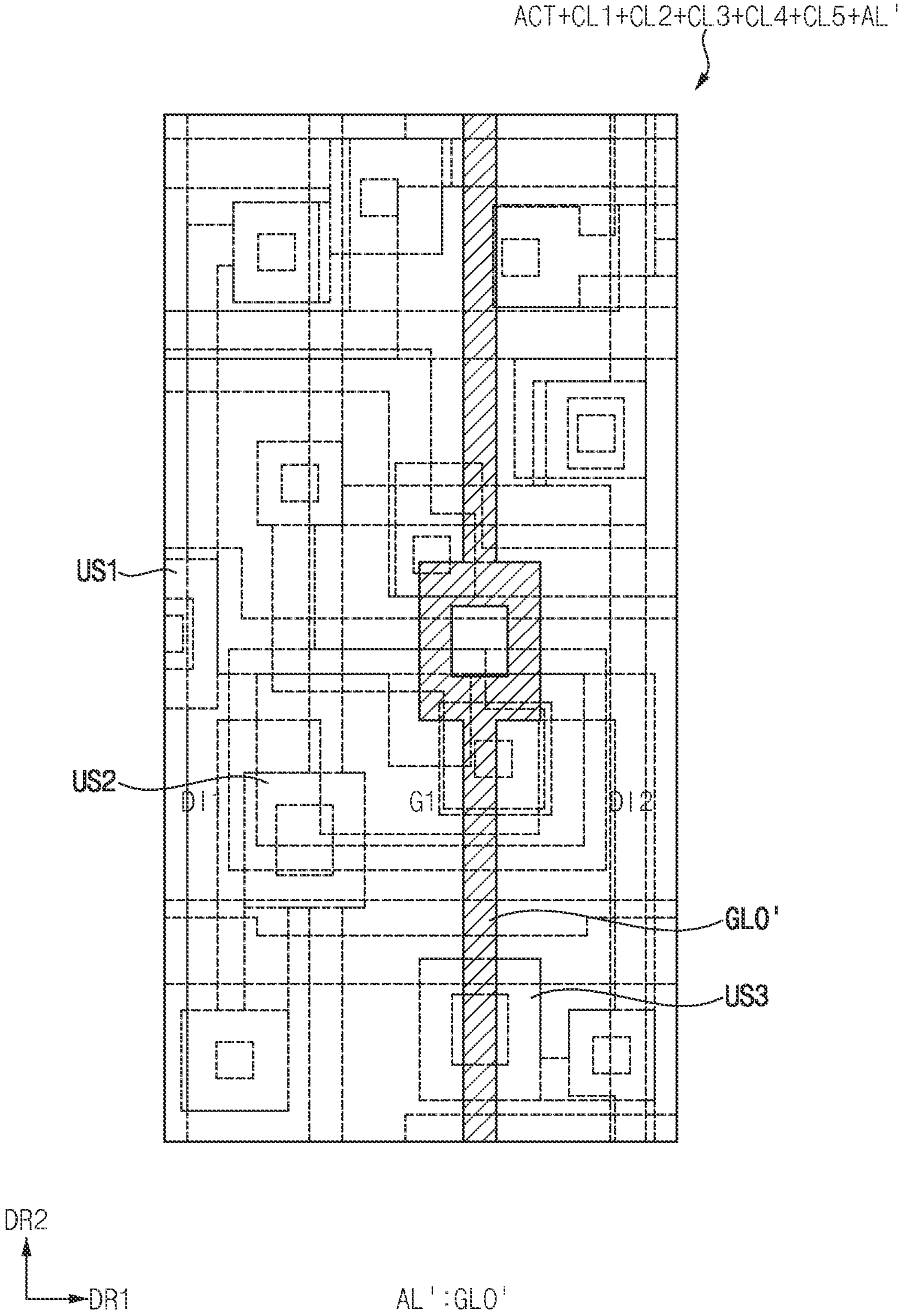
FIG. 17 is a diagram for describing the method of manufacturing the display device of FIG. 15.

FIG. 17 is a diagram for describing the method of manufacturing the display device of FIG. 15. At least some of the components illustrated in FIG. 17 may be connected to a plurality of pixel circuits.

Referring to FIG. 17, a second via-insulating layer may be formed on a fifth conductive layer CL5. The second via-insulating layer may be formed to cover the fifth conductive layer CL5.

The second via-insulating layer may include an organic insulating material. In embodiments, organic insulating material that may be used as the second via-insulating layer may include photoresist, polyacryl-based resin, polyimide-based resin, acryl-based resin, etc. These may be used alone or in any combinations with each other.

A global line layer AL' may be formed on the fifth conductive layer CL5 (S700'). Specifically, the global line layer AL' may be formed on the second via-insulating layer. The global line layer AL' may include the global line GLO'. The global line layer AL' may include a metal, an alloy, a metal nitride, a conductive metal oxide, a transparent conductive material, etc. These may be used alone or in any combinations with each other.

The global line GLO' may extend in the second direction DR2. The global line GLO' may be connected to a third upper source pattern US3 through a contact hole.

In the applying a constant voltage to the global line GLO' (S800'), a first constant voltage may be provided to the first upper source pattern US1. Accordingly, the first constant voltage may be provided to the control gate electrode (e.g., the control gate electrode CG of FIG. 10) through the fifth lower source pattern (e.g., the fifth lower source pattern LS5 of FIG. 12) and the third upper gate pattern (e.g., the third upper gate pattern UG3 of FIG. 11).

A second constant voltage may be provided to the second upper source pattern US2.

Accordingly, the second constant voltage may be provided to the first extension portion (e.g., the first extension portion EP1 of FIG. 8) of the active pattern through the second connection electrode (e.g., the second connection electrode CE2 of FIG. 12). That is, the second constant voltage may be provided to the first conductor area DI1 of the first transistor through the second connection electrode.

A third constant voltage may be provided to the global line GLO'. Accordingly, the third constant voltage may be provided to the second extension portion of the N-th row (e.g., the second extension portion of the N-th row EP2(N) of FIG. 8) of the active pattern through the third upper source pattern US3 and the third connection electrode (e.g., the third connection electrode CE3 of FIG. 12). That is, the third constant voltage may be provided to the second conductor area DI2 of the first transistor through the third connection electrode.

The providing a constant voltage to each of the first upper source pattern US1, the second upper source pattern US2, and the global line GLO' may include a first voltage providing operation and a second voltage providing operation. In the first voltage providing operation and the second voltage providing operation may be substantially the same as the first voltage providing operation and the second voltage providing operation described with reference to FIG. 13, respectively. Therefore, a detailed description thereof will be omitted.

The global line layer AL' formed on the second via-insulating layer may be removed (S900'). That is, the global line layer AL' may be removed so that the pixels included in the M-th pixel column that share the global line GLO' may be individually driven.

A light-emitting element layer may be formed on the fifth conductive layer CL5 (S1000'). Specifically, the light-emitting element layer may be formed on the second via-insulating layer. The light-emitting element layer may include the anode electrode, the pixel defining layer, the light-emitting layer, the cathode electrode, and the encapsulation layer.

The disclosure may be provided to various display devices. The present disclosure is applicable to various display devices such as display devices for vehicles, ships and aircraft, portable communication devices, display devices for exhibition or information transmission, medical display devices, or the like, for example.

The foregoing is illustrative of the embodiments of the disclosure, and is not to be construed as limiting thereof. Although a few embodiments have been described with reference to the drawing figures, those skilled in the art will readily appreciate that many variations and modifications may be made therein without departing from the spirit and scope of the disclosure as defined in the appended claims.

What is claimed is:

1. A method of manufacturing a display device, the method comprising:

forming an active pattern including a first conductor area, a semiconductor area adjacent to the first conductor area, and a second conductor area spaced apart from the first conductor area with the semiconductor area interposed therebetween on a substrate;

forming a first conductive layer including a floating gate electrode overlapping the semiconductor area on the active pattern;

forming a second conductive layer including a control gate electrode overlapping the floating gate electrode on the first conductive layer;

forming a global line layer including a first global line electrically connected to the control gate electrode on the second conductive layer;

providing a first constant voltage to the first global line; and removing the global line layer.

2. The method of claim 1, wherein in the providing the first constant voltage to the first global line, a second constant voltage is provided to the first conductor area and a third constant voltage is provided to the second conductor area.

3. The method of claim 2, further comprising:

forming a light-emitting element layer on the second conductive layer after the removing the global line layer.

4. The method of claim 3, wherein the first conductor area, the semiconductor area, the second conductor area, the floating gate electrode, and the control gate electrode define a driving transistor which provides a driving current to the light-emitting element layer.

5. The method of claim 4, wherein the providing the first constant voltage to the first global line includes compensating for a threshold voltage of the driving transistor.

6. The method of claim 5, wherein the compensating for the threshold voltage of the driving transistor includes:

an operation in which the first constant voltage has a relatively low level voltage and the second constant voltage has a voltage higher than the first constant voltage; and an operation in which the first constant voltage has a relatively high level voltage and the second constant voltage has a voltage lower than the first constant voltage.

7. The method of claim 6, wherein an absolute value of a difference between the first constant voltage and the second constant voltage is greater than or equal to about 80 volts and less than or equal to about 100 volts.

8. The method of claim 2, wherein an absolute value of a difference between the second constant voltage and the third constant voltage is greater than or equal to about 0 volt and less than or equal to about 0.2 volt.

9. The method of claim 1, wherein the forming the global line layer includes forming a second global line electrically connected to the first conductor area.

10. The method of claim 9, wherein the forming the global line layer includes forming a third global line electrically connected to the second conductor area.

11. The method of claim 1, wherein at least one conductive layer is further disposed between the global line layer and the second conductive layer.

12. The method of claim 1, wherein the first global line is electrically connected to the floating gate electrode through at least one connection electrode.

13. A method of manufacturing a display device, the method comprising:

forming an active pattern including a first conductor area, a semiconductor area adjacent to the first conductor area, and a second conductor area spaced apart from the first conductor area with the semiconductor area interposed therebetween on a substrate;

forming a first conductive layer including a floating gate electrode overlapping the semiconductor area on the active pattern;

forming a second conductive layer including a control gate electrode overlapping the floating gate electrode on the first conductive layer;

forming a global line layer including a first global line electrically connected to the second conductor area of the active pattern on the second conductive layer;

providing a first constant voltage to the first global line;

removing the global line layer; and forming a light-emitting element layer on the second conductive layer after the removing the global line layer.

14. The method of claim 13, wherein in the providing the first constant voltage to the first global line, a second constant voltage is provided to the control gate electrode and a third constant voltage is provided to the first conductor area.

15. The method of claim 14, wherein the first conductor area, the semiconductor area, the second conductor area, the floating gate electrode, and the control gate electrode define a driving transistor which provides a driving current to the light-emitting element layer.

16. The method of claim 15, wherein the providing the first constant voltage to the first global line includes compensating for a threshold voltage of the driving transistor.

17. The method of claim 16, wherein the compensating for the threshold voltage of the driving transistor includes:

an operation in which the second constant voltage has a relatively low level voltage and the third constant voltage has a voltage higher than the second constant voltage; and an operation in which the second constant voltage has a relatively high level voltage and the third constant voltage has a voltage lower than the second constant voltage.

18. The method of claim 17, wherein an absolute value of a difference between the second constant voltage and the third constant voltage is greater than or equal to about 80 volts and less than or equal to about 100 volts.

19. The method of claim 13, wherein the forming the global line layer includes forming a second global line electrically connected to the first conductor area.

20. The method of claim 19, wherein the forming the global line layer includes forming a third global line electrically connected to the control gate electrode.

* * * * *